(12) United States Patent
Tai et al.

(10) Patent No.: US 7,714,393 B2
(45) Date of Patent: May 11, 2010

(54) SEMICONDUCTOR DEVICE AND METHOD FOR MANUFACTURING SAME

(75) Inventors: Kaori Tai, Kanagawa (JP); Masanori Tsukamoto, Kanagawa (JP); Masashi Nakata, Kanagawa (JP); Itaru Oshiyama, Kanagawa (JP)

(73) Assignee: Sony Corporation, Tokyo (JP)

( * ) Notice: Subject to any disclaimer, the term of this patent is extended or adjusted under 35 U.S.C. 154(b) by 268 days.

(21) Appl. No.: 11/869,882

(22) Filed: Oct. 10, 2007

(65) Prior Publication Data

US 2008/0087966 A1 Apr. 17, 2008

(30) Foreign Application Priority Data

Oct. 16, 2006 (JP) ............................ 2006-281026
Jun. 19, 2007 (JP) ............................ 2007-161030

(51) Int. Cl.
*H01L 27/088* (2006.01)

(52) U.S. Cl. ............... 257/369; 257/E21.632; 257/E27.052; 438/233

(58) Field of Classification Search ............ 257/369, 257/E21.632, E27.062; 438/233
See application file for complete search history.

(56) References Cited

U.S. PATENT DOCUMENTS 7,229,873 B2 * 6/2007 Colombo et al. ............ 438/231

2002/0058374 A1 * 5/2002 Kim et al. .................... 438/228
2005/0205940 A1 * 9/2005 Ootsuka ...................... 257/374

FOREIGN PATENT DOCUMENTS

| JP | 2005-294799 | 10/2005 |
| JP | 2005-347631 | 12/2005 |
| JP | 2006-005087 | 1/2006 |
| JP | 2006-114591 | 4/2006 |

OTHER PUBLICATIONS

A Japanese Office Action dated Jan. 20, 2008 issued in connection with counterpart Japanese Patent Application No. 2007-161030.

* cited by examiner

*Primary Examiner*—Trung Dang
(74) *Attorney, Agent, or Firm*—Sonnenschein Nath & Rosenthal LLP

(57) ABSTRACT

Disclosed herein is a semiconductor device including an N-channel insulated gate field effect transistor and a P-channel insulated gate field effect transistor, the device having: a first insulating layer and a second insulating layer; and gate electrode contact plugs. Each of the gate electrodes of the N-channel insulated gate field effect transistor and the P-channel insulated gate field effect transistor is buried in a gate electrode formation opening provided in the first insulating layer.

13 Claims, 18 Drawing Sheets

SEMICONDUCTOR DEVICE AND METHOD FOR MANUFACTURING SAME

CROSS REFERENCES TO RELATED APPLICATIONS

The present invention contains subject matter related to Japanese Patent Application JP 2006-281026 filed with the Japan Patent Office on Oct. 16, 2006 and Japanese Patent Application JP 2007-161030 filed with the Japan Patent Office on Jun. 19, 2007, the entire contents of which being incorporated herein by reference.

BACKGROUND OF THE INVENTION

1. Field of the Invention

The present invention relates to a semiconductor device including an N-channel insulated gate field effect transistor and a P-channel insulated gate field effect transistor, and a method for manufacturing the same.

2. Description of the Related Art

For an insulated gate field effect transistor (metal insulator semiconductor FET (MISFET)) such as a MOSFET, the combination of a gate insulating film composed of silicon oxide and a gate electrode formed of a polycrystalline silicon film is widely used. For example, in a CMOS semiconductor device, there is a need for an N-channel MOSFET (hereinafter, referred to simply as NMOS) and a P-channel MOSFET (hereinafter, referred to simply as PMOS) included in the CMOS semiconductor device to have threshold voltages that are sufficiently low and symmetric with each other. Even for MOSFETs of which gate length is 0.1 µm or smaller, a gate electrode having the optimum work function value can be formed for each of an NMOS and PMOS by forming the gate electrode by using polycrystalline silicon and adjusting an impurity in the gate electrode and the concentration thereof.

Presently, miniaturization of transistors is being advanced based on the so-called scaling rule, and thereby enhancement in the integration degree and the operating speed of semiconductor devices is being promoted. For miniaturization of an insulated gate field effect transistor, it may be required to suppress the influence of the so-called short-channel effect. As long as a gate electrode is composed of a semiconductor material, it may be impossible to effectively suppress the depletion of the gate electrode, which is one of factors in the short-channel effect. To address this, there has been proposed a scheme in which a gate electrode is formed by using a conductive material such as a metal or metal nitride. As schemes for forming a gate electrode by using a conductive material, there has been proposed a method in which e.g. a metal film is deposited instead of a polycrystalline silicon film and a gate electrode is formed by pattering this metal film similarly to existing methods. Furthermore, there has also been proposed a method in which a gate electrode is formed by a so-called damascene process of burying the electrode in a gate electrode formation opening (refer to e.g., Atsushi Yagishita et al., "High Performance Metal Gate MOSFETs Fabricated by CMP for 0.1 µm Regime", International Electron Devices Meeting 1998 Technical Digest pp. 785 to 788 (1998)). In the method of forming a gate electrode by a damascene process, a gate insulating film composed of an insulating material (e.g., hafnium oxide) of which relative dielectric constant is higher than that of silicon oxide is formed in a gate electrode formation opening arising from removal of a dummy gate, and then a gate electrode is formed. In this damascene process, various kinds of heat treatment (e.g., annealing treatment for activation of an impurity in source/drain regions) have been completed before the formation of the gate electrode. Therefore, mobility deterioration and so on hardly occur, and thus an insulated gate field effect transistor having enhanced characteristics can be provided.

Different kinds of insulated gate field effect transistors, such as an NMOS and PMOS, typically have different optimum work function values of gate electrodes. In a configuration in which the gate electrode of an NMOS and the gate electrode of a PMOS included in a CMOS semiconductor device are formed by using the same conductive material (e.g., the same kind of metal), it is difficult to ensure symmetrical threshold voltage characteristic and so on. In other words, it is difficult to form a configuration in which each of the gate electrodes of an NMOS and PMOS has the optimum work function value. To address this, there has also been proposed a scheme in which the gate electrodes of an NMOS and PMOS are formed by using different conductive materials. In addition, in order to achieve both optimization of the work function value of a gate electrode and low resistivity of the gate electrode, there has also been proposed the following method relating to formation of a gate electrode based on a damascene process. Specifically, in this method, initially a layer composed of a conductive material having a favorable work function value (for convenience, referred to as a work function control layer) is formed in a gate electrode formation opening (more specifically, in a bottom region and side region of the gate electrode formation opening that has the bottom region, the side region, and a center region surrounded by the bottom region and the side region). Subsequently, in the center region, another conductive material layer having lower resistivity (ratio resistivity) (for convenience, referred to as a center layer) is formed, so that a gate electrode is formed.

Miniaturization of insulated gate field effect transistors decreases the alignment margin in formation of contact plugs that are provided in an interlayer insulating layer covering a gate electrode and source/drain regions and are connected to the top surface of the gate electrode and the source/drain regions. Therefore, it is preferable to simultaneously form these contact plugs through a series of processes. The contact plugs are formed by forming in an interlayer insulating layer a contact plug formation opening having the bottom through which the top surface of a gate electrode is exposed and contact plug formation openings having the bottoms through which source/drain regions are exposed, and then burying tungsten or the like in these openings. The contact plug formation opening is formed by using known lithography and etching techniques.

Due to the difference in the height between the top surface of the gate electrode and the source/drain regions, the thickness of the interlayer insulating layer covering the gate electrode and the source/drain regions is relatively smaller on the gate electrode and relatively larger on the source/drain regions, at the timing after planarization treatment for the interlayer insulating layer. Consequently, in the formation of the contact plug formation openings in the interlayer insulating layer through a series of etching processes, the top surface of the gate electrode exposed at the bottom of the contact plug formation opening is subjected to the etching treatment for a relatively longer period compared with the source/drain regions exposed at the bottoms of the contact plug formation openings. Therefore, as the combination between the condition of the etching of the interlayer insulating layer and the material of the gate electrode, a combination that can offer a sufficiently high etching selection ratio may be required. Moreover, the material of the gate electrode is desirable to have sufficient resistance also against a series of chemical treatments performed after the etching.

SUMMARY OF THE INVENTION

However, when in a semiconductor device including different kinds of insulated gate field effect transistors, such as a CMOS semiconductor device or BiCMOS semiconductor device including an NMOS and PMOS, the gate electrodes of the NMOS and the PMOS are formed by using different conductive materials, it is difficult to satisfy all of the following conditions: each of the gate electrodes has a favorable work function value; the material of each of the gate electrodes provides a sufficiently high etching selection ratio; and the material of each of the gate electrodes has sufficient resistance against chemical treatment performed after the etching. This difficulty will act as a factor in inhibition of optimization of the fabrication process for the semiconductor device. In addition, when in formation of a gate electrode by a damascene process, the gate electrode is provided by forming a work function control layer in a gate electrode formation opening and then forming a center layer having lower resistivity, regions each composed of a respective one of the conductive materials (specifically, the conductive material of the work function control layer and the conductive material of the center layer) are exposed at the top surface of the gate electrode. Thus, for example, due to the difference in the etching selection ratio between these conductive materials, the planarity of the top surface of the gate electrode will be problematically deteriorated when the top surface is subjected to etching treatment.

Furthermore, as the gate length (the width of a gate electrode obtained when the gate electrode is cut along a virtual plane perpendicular to the extension direction of the gate electrode) becomes smaller, the area ratio of a work function control layer becomes relatively higher in a section of the gate electrode. As described above, the resistivity of the conductive material of a work function control layer is higher than that of the conductive material of a center layer in general. Accordingly, if the area ratio of a work function control layer becomes relatively higher, the electric resistance of the gate electrode becomes higher. The relationship between the gate length (GL) and the sheet resistance value of a gate electrode was calculated regarding a structure (see FIG. 14A) in which the height (T) of the gate electrode was 70 nm, the thickness of the gate insulating film composed of $HfO_2$ was 5 nm, the conductive material of the work function control layer was $HfSi_X$ (having a volume resistivity of 300 $\mu\Omega\cdot$cm), and the conductive material of the center layer was tungsten (W). The calculation results are shown in FIG. 14B. Parameters for the respective curves in FIG. 14B are as follows.

| Curve | Thickness of Work Function Control Layer | Electric Resistance of Center Layer |
|---|---|---|
| A | 5 nm | 15 $\mu\Omega$ |
| B | 10 nm | 15 $\mu\Omega$ |
| C | 20 nm | 15 $\mu\Omega$ |
| D | 5 nm | 30 $\mu\Omega$ |
| E | 10 nm | 30 $\mu\Omega$ |
| F | 20 nm | 30 $\mu\Omega$ |
| G | 5 nm | 100 $\mu\Omega$ |
| H | 10 nm | 100 $\mu\Omega$ |
| I | 20 nm | 100 $\mu\Omega$ |

For the above-described reason, there is a strong demand for measures that suppress the occurrence of the phenomenon in which the electric resistance of a gate electrode increases as a result of decrease in the gate length and corresponding relative increase in the area ratio of the work function control layer.

There is a desire for the present invention to provide a semiconductor device that includes different kinds of insulated gate field effect transistors and has a configuration and structure in which each gate electrode can be formed by using a conductive material having a favorable work function value and there is no need to take into consideration the relationship between the material of each gate electrode and the condition of etching of an interlayer insulating layer, and to provide a method for manufacturing the same. There is another desire for the present invention to provide a semiconductor device that includes different kinds of insulated gate field effect transistors and has a configuration and structure in which each gate electrode can be formed by using a conductive material having a favorable work function value and the electric resistance of each gate electrode hardly increases even when the gate length becomes smaller, and to provide a method for manufacturing the same.

According to a first embodiment of the present invention, there is provided a semiconductor device including an N-channel insulated gate field effect transistor and a P-channel insulated gate field effect transistor. The device includes:

a first insulating layer and a second insulating layer configured to be formed on the first insulating layer; and gate electrode contact plugs configured to penetrate the second insulating layer and be each connected to a respective one of gate electrodes of the N-channel insulated gate field effect transistor and the P-channel insulated gate field effect transistor, and source/drain region contact plugs configured to penetrate the first insulating layer and the second insulating layer and be each connected to a respective one of source/drain regions, wherein each of the gate electrodes of the N-channel insulated gate field effect transistor and the P-channel insulated gate field effect transistor is buried in a gate electrode formation opening provided in the first insulating layer, the gate electrode of the N-channel insulated gate field effect transistor has a bottom part, a side part, and a center part surrounded by the bottom part and the side part, and at least the bottom part and the side part are composed of a first conductive material, the gate electrode of the P-channel insulated gate field effect transistor has a bottom part, a side part, and a center part surrounded by the bottom part and the side part, and at least the bottom part and the side part are composed of a second conductive material different from the first conductive material, protective layers having electric conductivity are each formed on a top surface of a respective one of the gate electrodes of the N-channel insulated gate field effect transistor and the P-channel insulated gate field effect transistor, and the gate electrode contact plug for the N-channel insulated gate field effect transistor is connected via the protective layer to the top surface of the gate electrode of the N-channel insulated gate field effect transistor, and the gate electrode contact plug for the P-channel insulated gate field effect transistor is connected via the protective layer to the top surface of the gate electrode of the P-channel insulated gate field effect transistor.

According to the first embodiment of the present invention, there is also provided a method for manufacturing a semiconductor device including an N-channel insulated gate field effect transistor and a P-channel insulated gate field effect transistor. The method includes the steps of:

preparing a base that includes channel forming regions and source/drain regions of the N-channel insulated gate field effect transistor and the P-channel insulated gate field effect transistor, a first insulating layer, gate electrode formation openings provided in the first insulating layer for the N-channel insulated gate field effect transistor and the P-channel insulated gate field effect transistor, and a gate insulating film provided at least on bottoms of the gate electrode formation openings;

forming a first conductive material layer composed of a first conductive material at least in a bottom region and a side region of the gate electrode formation opening for the N-channel insulated gate field effect transistor, having the bottom region, the side region, and a center region surrounded by the bottom region and the side region, to thereby form a gate electrode of which at least bottom part and side part are composed of the first conductive material, and forming a second conductive material layer composed of a second conductive material different from the first conductive material at least in a bottom region and a side region of the gate electrode formation opening for the P-channel insulated gate field effect transistor, having the bottom region, the side region, and a center region surrounded by the bottom region and the side region, to thereby form a gate electrode of which at least bottom part and side part are composed of the second conductive material;

forming protective layers having electric conductivity on top surfaces of the gate electrodes of the N-channel insulated gate field effect transistor and the P-channel insulated gate field effect transistor;

forming a second insulating layer that covers an entire surface; and forming a gate electrode contact plug that penetrates the second insulating layer and is connected via the protective layer to the top surface of the gate electrode of the N-channel insulated gate field effect transistor, a gate electrode contact plug that penetrates the second insulating layer and is connected via the protective layer to the top surface of the gate electrode of the P-channel insulated gate field effect transistor, source/drain region contact plugs that penetrate the first insulating layer and the second insulating layer and are connected to the source/drain regions of the N-channel insulated gate field effect transistor, and source/drain region contact plugs that penetrate the first insulating layer and the second insulating layer and are connected to the source/drain regions of the P-channel insulated gate field effect transistor.

In the method for manufacturing a semiconductor device according to the first embodiment of the present invention, the protective layers can be formed by any of the following methods: various kinds of physical vapor deposition (PVD) such as evaporation typified by electron beam evaporation and filament evaporation, sputtering, ion plating, and laser ablation; various kinds of chemical vapor deposition (CVD); electrolytic plating; and electroless plating. It is preferable to selectively form the protective layers based on selective CVD among these methods. This method allows the protective layers to be selectively formed on the top surfaces of the gate electrodes without patterning, and thus can simplify the manufacturing process for a semiconductor device.

In the semiconductor device according to the first embodiment of the present invention or a semiconductor device manufactured by the method for manufacturing a semiconductor device according to the first embodiment of the present invention including the above-described preferred modes (hereinafter, these semiconductor devices will be often referred to collectively as "semiconductor device and so on according to the first embodiment of the present invention" simply), in the gate electrode of the N-channel insulated gate field effect transistor (hereinafter, it will be often referred to simply as an NMISFET gate electrode), having a bottom part and a side part (hereinafter, the bottom part and the side part will be often referred to collectively as a "shell part") and a center part (the remaining part of the gate electrode, and it will be often referred to as a "core part" as the contrary to the shell part) surrounded by the bottom part and the side part, the center part may be composed of the first conductive material for work function control or may be composed of a conductive material different from the first conductive material. Similarly, the core part surrounded by the shell part of the gate electrode of the P-channel insulated gate field effect transistor (hereinafter, it will be often referred to simply as a PMISFET gate electrode) may be composed of the second conductive material for work function control or may be composed of a conductive material different from the second conductive material. For example, a form is available in which the whole of an NMISFET gate electrode is composed of the first conductive material for work function control (i.e., having a function to control the work function). Furthermore, a form is also available in which the shell part of an NMISFET gate electrode is composed of the first conductive material and the core part is composed of a conductive material of which resistivity is lower than that of the first conductive material. In the former form, the forming step for the NMISFET gate electrode can be simplified. In the latter form, the electric resistance of the NMISFET gate electrode can be lowered. In addition, further another conductive material layer may be formed between the core part and the shell part of a gate electrode. In other words, the gate electrode may be formed through stacking of three or more conductive material layers. The same holds also for a PMISFET gate electrode. As the first conductive material for work function control (i.e., having a function to control the work function), a conductive material that has a favorable work function value in terms of the relationship with the channel forming region of the N-channel insulated gate field effect transistor is appropriately selected. Similarly, as the second conductive material for work function control (i.e., having a function to control the work function), a conductive material that has a favorable work function value in terms of the relationship with the channel forming region of the P-channel insulated gate field effect transistor is appropriately selected.

The term "channel forming region" indicates not only a region in which the channel is actually formed but also a region in which the channel will be possibly formed. For example, partial portions of a semiconductor layer and semiconductor substrate positioned to face a gate electrode correspond to the "channel forming region". Furthermore, the "gate electrode" encompasses not only an electrode portion facing the "channel forming region" but also a lead-out electrode part as an extension from this electrode portion. Examples of the semiconductor device and so on according to the first embodiment of the present invention or the semiconductor device and so on according to the second embodiment of the present invention to be described later include a CMOS semiconductor device formed of an NMOS and PMOS, and a BiCMOS semiconductor device including a bipolar transistor in addition to an NMOS and PMOS.

In the method for manufacturing a semiconductor device according to the first embodiment of the present invention including the above-described preferred modes, the protective layers having electric conductivity are formed on the top surfaces of the respective gate electrodes of the N-channel insulated gate field effect transistor and the P-channel insulated gate field effect transistor, and then the second insulating layer covering the entire surface is formed. The multilayer structure formed of the first insulating layer and the second insulating layer will be often referred to as an interlayer insulating layer. In the method for manufacturing a semiconductor device according to the first embodiment of the present invention, in the formation of contact plug formation openings in the second insulating layer and the first insulating layer through a series of etching processes, the protective layers formed on the top surfaces of the gate electrodes are exposed at the bottoms of the contact plug formation openings in which the gate electrode contact plugs are to be formed. Therefore, although an NMISFET gate electrode and a PMISFET gate electrode are composed of different conductive materials, the differences in the etching selection ratio and so on between these conductive materials lead to no problem. The same holds also for the case in which an NMISFET gate electrode is composed of plural conductive materials different from each other and the case in which a PMISFET gate electrode is composed of plural conductive materials different from each other. Consequently, in the method for manufacturing a semiconductor device according to the first embodiment of the present invention, the etching process can be optimized based on the relationship between the interlayer insulating layer and the protective layers. Thus, the method for manufacturing a semiconductor device according to the first embodiment of the present invention enhances the flexibility of selection of conductive materials of gate electrodes to thereby allow improvement in characteristics of the semiconductor device and optimization of the manufacturing process.

The protective layers may be formed to cover the whole of the top surfaces of the respective gate electrodes of the N-channel insulated gate field effect transistor and the P-channel insulated gate field effect transistor. Alternatively, the protective layers may be formed to cover the bottoms of the contact plug formation openings in which the gate electrode contact plugs are to be formed and the top surfaces of partial portions of the gate electrodes near the bottoms.

According to a second embodiment of the present invention, there is provided a semiconductor device including an N-channel insulated gate field effect transistor and a P-channel insulated gate field effect transistor and being provided with an insulating layer, wherein each of gate electrodes of the N-channel insulated gate field effect transistor and the P-channel insulated gate field effect transistor is buried in a gate electrode formation opening provided in the insulating layer, the gate electrode of the N-channel insulated gate field effect transistor is composed of a first conductive material, the gate electrode of the P-channel insulated gate field effect transistor is composed of a second conductive material different from the first conductive material, and interconnect layers are formed to each cover a top surface of a respective one of the gate electrodes of the N-channel insulated gate field effect transistor and the P-channel insulated gate field effect transistor.

According to the second embodiment of the present invention, there is also provided a method for manufacturing a semiconductor device including an N-channel insulated gate field effect transistor and a P-channel insulated gate field effect transistor. The method includes the steps of:

preparing a base that includes channel forming regions and source/drain regions of the N-channel insulated gate field effect transistor and the P-channel insulated gate field effect transistor, an insulating layer, gate electrode formation openings provided in the insulating layer for the N-channel insulated gate field effect transistor and the P-channel insulated gate field effect transistor, and a gate insulating film provided at least on bottoms of the gate electrode formation openings;

forming a gate electrode composed of a first conductive material in the gate electrode formation opening for the N-channel insulated gate field effect transistor, and forming a gate electrode composed of a second conductive material different from the first conductive material in the gate electrode formation opening for the P-channel insulated gate field effect transistor; and forming interconnect layers that each cover a top surface of a respective one of the gate electrodes of the N-channel insulated gate field effect transistor and the P-channel insulated gate field effect transistor.

In the method for manufacturing a semiconductor device according to the second embodiment of the present invention, the step of forming interconnect layers may include the steps of forming an upper insulating layer on an entire surface, selectively removing partial portions of the upper insulating layer above the top surfaces of the gate electrodes of the N-channel insulated gate field effect transistor and the P-channel insulated gate field effect transistor, to thereby provide interconnect layer trenches in the upper insulating layer, filling the interconnect layer trenches with a conductive material layer, and removing the conductive material layer on the upper insulating layer. That is, the interconnect layers can be formed based on a so-called damascene process.

Alternatively, in the method for manufacturing a semiconductor device according to the second embodiment of the present invention, the step of forming interconnect layers may include the steps of forming a silicon layer, patterning the silicon layer, forming a metal layer on the entire surface, carrying out heat treatment for a reaction between a metal of the metal layer and silicon of the silicon layer to thereby form the interconnect layers each formed of a metal silicide layer, and removing the metal layer on the insulating layer.

In the semiconductor device according to the second embodiment of the present invention or a semiconductor device manufactured by the method for manufacturing a semiconductor device according to the second embodiment of the present invention including the above-described preferred modes (hereinafter, these semiconductor devices will be often referred to collectively as "semiconductor device and so on according to the second embodiment of the present invention" simply), the interconnect layer formed to cover the top surface of the gate electrode of the N-channel insulated gate field effect transistor and the interconnect layer formed to cover the top surface of the gate electrode of the P-channel insulated gate field effect transistor may be a common interconnect layer. That is, a structure is available in which an extended portion of the interconnect layer formed to cover the top surface of the gate electrode of the N-channel insulated gate field effect transistor is equivalent to the interconnect layer formed to cover the top surface of the gate electrode of the P-channel insulated gate field effect transistor.

In the semiconductor device and so on according to the second embodiment of the present invention including the above-described various preferred configurations, the insulating layer may exist between the gate electrode of the N-channel insulated gate field effect transistor and the gate electrode of the P-channel insulated gate field effect transistor. That is, the gate electrode of the N-channel insulated gate field effect transistor and the gate electrode of the P-channel insulated gate field effect transistor may be separated from each other. However, the structure of the semiconductor device is not limited thereto but the gate electrode of the P-channel insulated gate field effect transistor may exist as an extension of the gate electrode of the N-channel insulated gate field effect transistor.

Furthermore, in the semiconductor device and so on according to the second embodiment of the present invention including the above-described preferred configurations, the interconnect layers may be each formed of one conductive material layer. Alternatively, the interconnect layers may each have a multilayer structure formed of a lower conductive material layer and an upper conductive material layer, and the lower and upper conductive material layers may be formed of a silicon layer and a silicide layer, respectively.

In the semiconductor device and the method for manufacturing the same according to the second embodiment of the present invention, the interconnect layers are formed to cover the top surfaces of the respective gate electrodes of the N-channel insulated gate field effect transistor and the P-channel insulated gate field effect transistor. More specifically, the interconnect layers are formed on the top surfaces of these gate electrodes, and furthermore, are extended to the top surfaces of partial portions of the insulating layer near these gate electrodes.

In the semiconductor device and so on according to the first embodiment of the present invention including the above-described preferred modes, any of the following materials can be used for the gate electrodes: metals such as hafnium (Hf), tantalum (Ta), titanium (Ti), tungsten (W), molybdenum (Mo), ruthenium (Ru), nickel (Ni), and platinum (Pt) (including alloys of any of these metals); compounds of any of these metals such as nitrides; and compounds between a metal and semiconductor material such as metal silicides. As described above, as the material for work function control (i.e., having a function to control the work function) included at least in the shell part, a material (e.g., a conductive material composed of a metal, alloy, or metal compound such as a metal nitride) that has a favorable work function value in terms of the relationship with the channel forming region is appropriately selected. For example, when the channel forming region is an N-type, hafnium (Hf), tantalum (Ta), or the like can be selected. When the channel forming region is a P-type, molybdenum (Mo), ruthenium (Ru), nickel (Ni), platinum (Pt), or the like can be selected. However, the material is not limited thereto. The gate electrodes can be formed by a known damascene process. Specifically, in a damascene process, gate electrode formation openings are filled with a conductive material by carrying out any of the following deposition methods alone or in proper combination: various kinds of PVD; various kinds of CVD including atomic layer deposition (ALD) and metal organic chemical vapor deposition (MOCVD); electrolytic plating; and electroless plating. Subsequently, planarization treatment is carried out by chemical mechanical polishing (CMP) or the like.

In the semiconductor device and so on according to the first embodiment of the present invention, any of the following materials having electric conductivity can be widely used for the protective layers: metals such as tungsten (W), tantalum (Ta), platinum (Pt), and titanium (Ti) (including alloys of any of these metals); compounds of any of these metals such as nitrides; and compounds between a metal and semiconductor material such as metal silicides. It is preferable to select, as the material of the protective layers, a substance that offers a sufficiently high etching selection ratio with respect to the material of the interlayer insulating layer in the etching process for the interlayer insulating layer. The protective layer may have either a single-layer structure or multilayer structure. For example, the protective layer may be formed through stacking of plural materials different from each other. Furthermore, the protective layer may be formed by using the same material as that of the gate electrode, or alternatively may be formed by using a material different from the material of the gate electrode.

In the semiconductor device and so on according to the second embodiment of the present invention including the above-described preferred modes, as the material for work function control (i.e., having a function to control the work function) included in the gate electrode of the N-channel insulated gate field effect transistor, a conductive material composed of a metal, alloy or metal compound typified by a metal nitride, such as hafnium (Hf), hafnium silicide (HfSi$_x$), tantalum (Ta), or TaC, can be used. Furthermore, as the material for work function control (i.e., having a function to control the work function) included in the gate electrode of the P-channel insulated gate field effect transistor, a conductive material composed of a metal, alloy or metal compound typified by a metal nitride, such as molybdenum (Mo), ruthenium (Ru), nickel (Ni), platinum (Pt), TiN, or tungsten (W), can be used. The gate electrodes each have also a function to control the work function. Furthermore, in some cases, the gate electrode has also a function as the protective layer in the semiconductor device and so on according to the first embodiment of the present invention. The gate electrodes can be formed by a known damascene process. Specifically, in a damascene process, gate electrode formation openings are filled with a conductive material by carrying out any of the following deposition methods alone or in proper combination: various kinds of PVD; various kinds of CVD including ALD and MOCVD; electrolytic plating; and electroless plating. Subsequently, planarization treatment is carried out by chemical mechanical polishing (CMP), dry etching, etchback, or the like.

In the semiconductor device and so on according to the second embodiment of the present invention, when the interconnect layer is formed by using one conductive material layer, this conductive material layer is composed of e.g. tungsten (W), TiN, aluminum (Al), or copper (Cu). When the interconnect layer is formed by using e.g. tungsten (W), an adhesion layer formed of a Ti layer or TiN layer may be formed under the interconnect layer. On the other hand, when the interconnect layer is provided with a multilayer structure formed of a lower conductive material layer and an upper conductive material layer, the lower conductive material layer can be formed by using a silicon layer (e.g., a polycrystalline silicon layer or amorphous silicon layer), and the upper conductive material layer can be formed by using a nickel silicide layer, nickel-platinum silicide layer, cobalt silicide layer, or titanium silicide layer. In this case, the metal layer is composed of nickel, nickel-platinum, cobalt, or titanium.

In the semiconductor device and the method for manufacturing the same according to the first embodiment of the present invention and the semiconductor device and the method for manufacturing the same according to the second embodiment of the present invention (hereinafter, these devices and methods will be often referred to collectively as "the present invention" simply), the gate insulating film can be formed after the gate electrode formation openings are formed in the first insulating layer or the insulating layer. Alternatively, it is also possible to form the first insulating layer or the insulating layer after the formation of the gate insulating film, and then form the gate electrode formation openings. In this case, however, the gate electrode formation openings have to be formed in such a way that the gate insulating film is left at the bottoms of the openings. Examples of the material of the gate insulating film include, in addition to $SiO_2$-based materials, SiOF-based materials, and SiN-based materials, which have been generally used, so-called high relative dielectric constant materials of which relative dielectric constant k ($=\epsilon/\epsilon_0$) is substantially 4.0 or higher. Examples of the high relative dielectric constant material include $HfO_2$, $ZrO_2$, $Al_2O_3$, $Y_2O_3$, and $La_2O$. The gate insulating film may be formed by using either one kind of material or plural kinds of materials. The gate insulating film may be formed as either a single film (including a composite film composed of plural materials) or multilayer film. The gate insulating films of the N-channel insulated gate field effect transistor and the P-channel insulated gate field effect transistor can be formed by using either the same material or materials different from each other. The gate insulating film can be formed by a well-known method. In particular, ALD, MOCVD, or the like can be used as a method for forming the gate insulating film composed of the above-described high relative dielectric constant material.

Also in the semiconductor device and the method for manufacturing the same according to the second embodiment of the present invention, it is desirable to form the second insulating layer on the entire surface after the formation of the interconnect layers. The insulating layer in the semiconductor device and the method for manufacturing the same according to the second embodiment of the present invention will be referred to as the first insulating layer in some cases, and a multilayer structure formed of the insulating layer (first insulating layer) and the second insulating layer will be referred to as the interlayer insulating layer in some cases.

In the present invention, examples of the material of the first insulating layer, the second insulating layer, the insulating layer, and the upper insulating layer include $SiO_2$, SiN, SiON, SiOF, SiC, and low dielectric constant insulating materials of which dielectric constant k ($=\epsilon/\epsilon_0$) is e.g. 3.5 or lower, such as organic SOG, polyimide-based resin, and fluorine-based resin (e.g., fluorocarbon, amorphous tetrafluoroethylene, polyarylether, arylether fluoride, polyimide fluoride, parylene, benzocyclobutene, amorphous carbon, cycloperfluorocarbon polymer, and fluorofullerene). The first insulating layer, the second insulating layer, the insulating layer, and the upper insulating layer can be formed by using a multilayer structure formed of any of these materials. As the material of the contact plugs provided in the interlayer insulating layer, polycrystalline silicon doped with an impurity or a refractory metal material such as tungsten (W) can be used. In addition, copper (Cu) is also available. The contact plugs can be formed by providing contact plug formation openings in the interlayer insulating layer by RIE or the like and then filling the contact plug formation openings with the above-described material by a known method. For example, the contact plugs can be formed by burying tungsten in the contact plug formation openings by blanket CVD and then removing the excess tungsten layer on the interlayer insulating layer. A form is also available in which a Ti layer and TiN layer as an adhesion layer is formed inside the contact plug formation openings, and then tungsten is buried in the contact plug formation openings by blanket CVD.

As the base including the source/drain regions, the channel forming regions and so on used in the present invention, besides a semiconductor substrate, a support member of which surface has a semiconductor layer (e.g., a glass substrate, quartz substrate, silicon substrate of which surface has an insulating layer, plastic substrate, or plastic film) can be used. The insulated gate field effect transistor is formed in e.g. a well region or the like in a semiconductor substrate or semiconductor layer. A so-called element isolation region having e.g. a trench structure may be formed between the insulated gate field effect transistors. The element isolation region may have a LOCOS structure, or may be based on the combination of a trench structure and LOCOS structure. More alternatively, the base having an SOI structure arising from SIMOX or substrate bonding may be used. In this case, the formation of the element isolation region is unnecessary.

In the semiconductor device and the method for manufacturing the same according to the first embodiment of the present invention, in the formation of the contact plug formation openings in the interlayer insulating layer through a series of etching processes, the protective layers formed on the top surfaces of the gate electrodes are exposed at the bottoms of the contact plug formation openings in which the gate electrode contact plugs are to be formed. Therefore, in any of the case in which the top surface of the NMISFET gate electrode and the top surface of the PMISFET gate electrode are composed of different conductive materials, the case in which the top surface of the NMISFET gate electrode is composed of plural conductive materials different from each other, and the case in which the top surface of the PMISFET gate electrode is composed of plural conductive materials different from each other, the differences in the etching selection ratio and so on among these conductive materials lead to no problem. Thus, the semiconductor device and the method for manufacturing the same according to the first embodiment of the present invention enhance the flexibility of selection of conductive materials of the gate electrodes to thereby allow improvement in characteristics of the semiconductor device and optimization of the manufacturing process.

In the semiconductor device and the method for manufacturing the same according to the second embodiment of the present invention, the interconnect layers are formed to cover the top surfaces of the respective gate electrodes of the N-channel insulated gate field effect transistor and the P-channel insulated gate field effect transistor. Therefore, each of the gate electrodes can be formed by using a conductive material having a favorable work function value. In addition, because the interconnect layers are provided, increase in the electric resistance hardly occurs as a whole even when the gate length becomes smaller. Moreover, if contact plugs are provided above the interconnect layers, in the formation of the contact plug formation openings in the interlayer insulating layer through a series of etching processes, the interconnect layers are exposed at the bottoms of the contact plug formation openings in which the gate electrode contact plugs are to be formed. Therefore, although the top surface of the NMISFET gate electrode and the top surface of the PMISFET gate electrode are composed of different conductive materials, the differences in the etching selection ratio and so on between these conductive materials lead to no problem. Thus, the semiconductor device and the method for manufacturing the same according to the second embodiment of the present invention enhance the flexibility of selection of conductive materials of the gate electrodes to thereby allow improvement in characteristics of the semiconductor device and optimization of the manufacturing process.

DETAILED DESCRIPTION OF THE PREFERRED EMBODIMENTS

Embodiments of the present invention will be described below with reference to the accompanying drawings.

First Embodiment

A first embodiment of the present invention relates to a semiconductor device and a method for manufacturing the same according to the first embodiment of the present invention. Insulated gate field effect transistors included in the semiconductor device of the first embodiment are MOSFETs. Furthermore, the semiconductor device of the first embodiment includes an NMOS and PMOS. This is the same also in other embodiments to be described later.

Figure 1A:
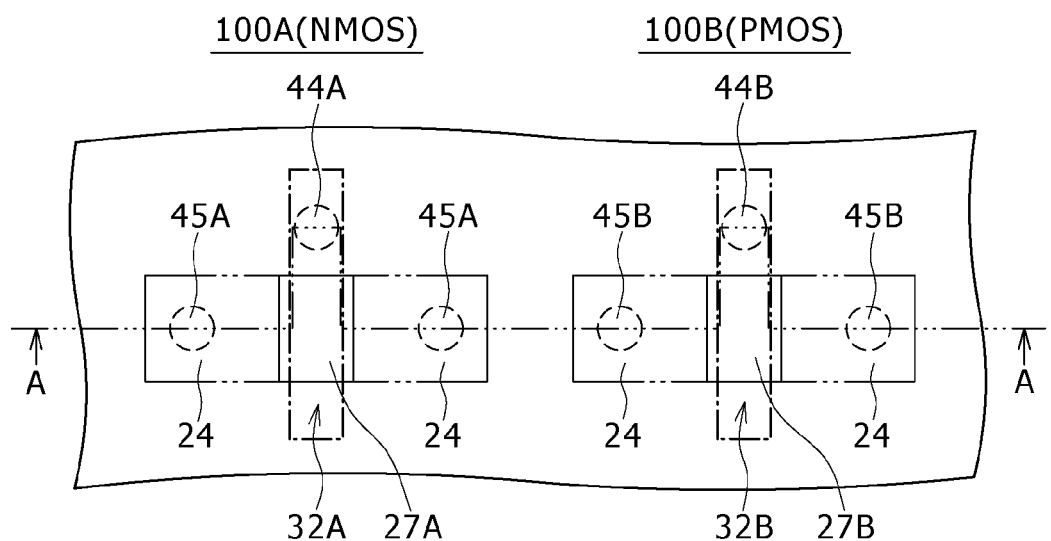
FIG. 1A is a diagram schematically showing a projected image of an N-channel insulated gate field effect transistor and a P-channel insulated gate field effect transistor included in a semiconductor device according to a first embodiment of the present invention.
Figure 1B:
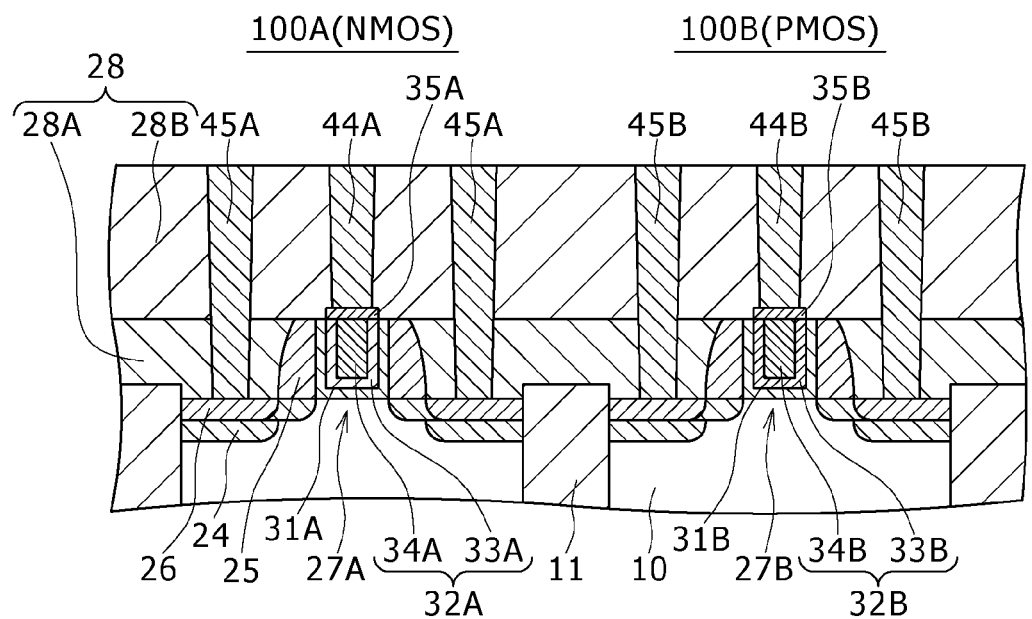
FIG. 1B is a partial sectional view along the three-dot chain line indicated by arrowheads A in FIG. 1A.

FIG. 1A schematically shows a projected image of an NMOS 100A and a PMOS 100B included in the semiconductor device of the first embodiment. In FIG. 1(A), the dashed line represents various kinds of contact plugs, the one-dot chain line represents gate electrodes, and the two-dot chain line represents source/drain regions and channel forming regions. FIG. 1B is a partial sectional view along the three-dot chain line indicated by arrowheads A in FIG. 1A.

Figure 2A:
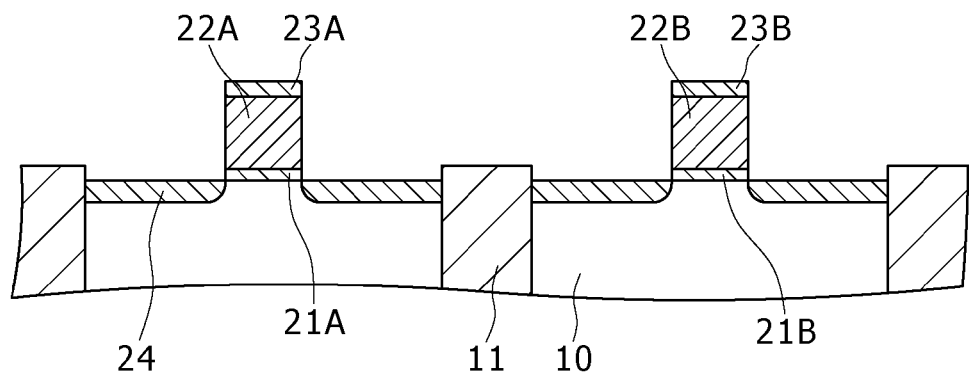
FIGS. 2A to 2M are schematic partial end views of a semiconductor substrate and so on, for explaining a method for manufacturing the semiconductor device of the first embodiment.
Figure 2B:
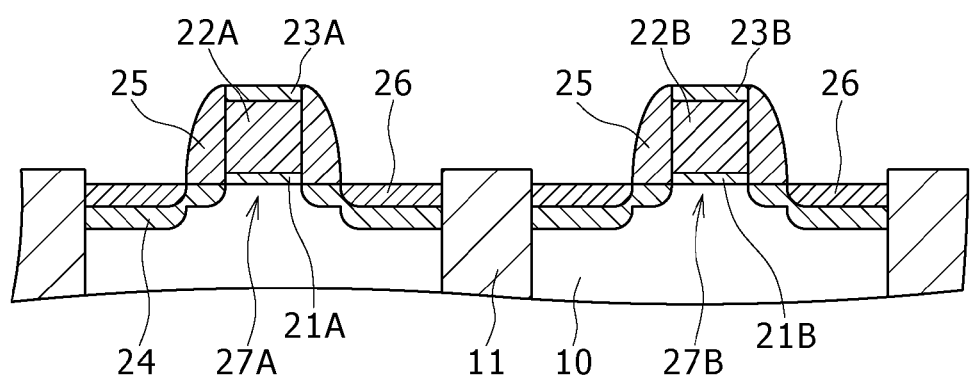
Figure 2C:
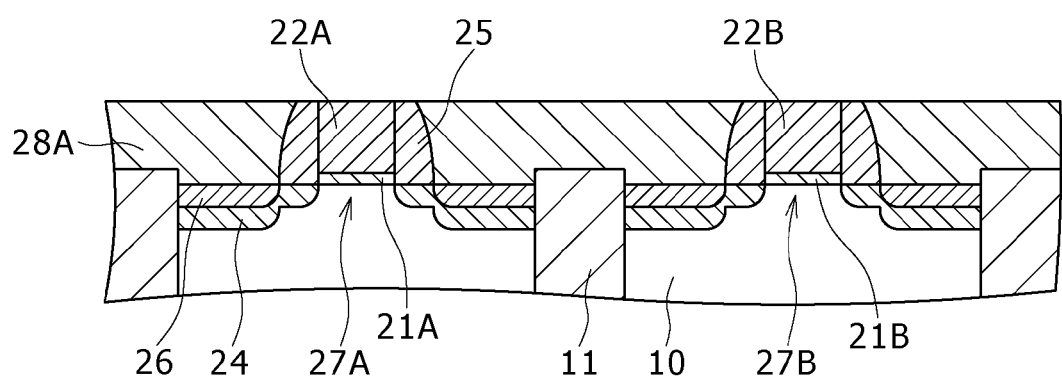
Figure 2D:
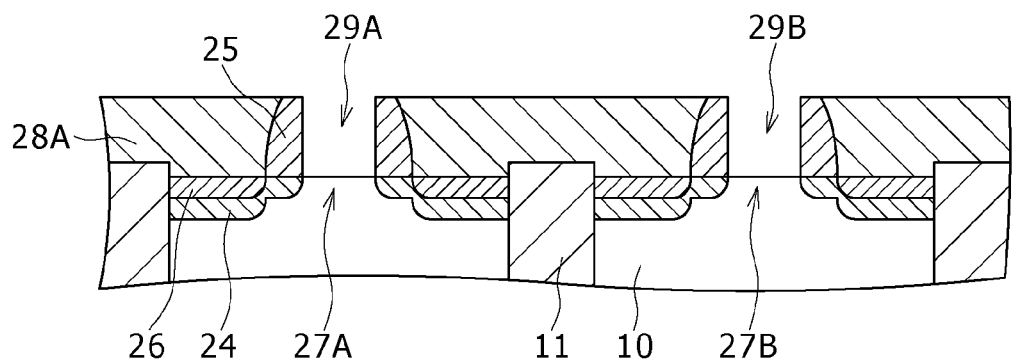

The semiconductor device of the first embodiment includes the NMOS 100A as an N-channel insulated gate field effect transistor and the PMOS 100B as a P-channel insulated gate field effect transistor. Furthermore, this semiconductor device includes a first insulating layer 28A and a second insulating layer 28B formed on the first insulating layer 28A. The multilayer structure of the first insulating layer 28A and the second insulating layer 28B will be referred to as an interlayer insulating layer 28. The semiconductor device includes also gate electrode contact plugs 44A and 44B that penetrate the second insulating layer 28B and are connected to the respective gate electrodes 32A and 32B of the NMOS 100A and the PMOS 100B. In addition, the semiconductor device further includes source/drain region contact plugs 45A and 45B that penetrate the first insulating layer 28A and the second insulating layer 28B and are connected to the respective source/drain regions 24. The gate electrodes 32A and 32B of the NMOS 100A and the PMOS 100B are buried in gate electrode formation openings 29A and 29B (see FIGS. 2D to 2F) provided in the first insulating layer 28A.

The gate electrode 32A of the NMOS 100A has a bottom part and side part (hereinafter, the bottom part and the side part will be often referred to collectively as a "shell part") and a center part (the remaining part of the gate electrode, and it will be often referred to as a "core part" as the contrary to the shell part, hereinafter) surrounded by the shell part. Of these parts, at least the shell part is composed of a first conductive material for work function control. More specifically, the gate electrode 32A is formed of a first conductive material layer 33A that is deposited in the gate electrode formation opening 29A (see FIG. 2D) and is composed of the first conductive material (e.g., $HfSi_x$), and a third conductive material layer 34A deposited on the first conductive material layer 33A. The first conductive material layer 33A is formed as the shell part of the gate electrode 32A, and the third conductive material layer 34A is formed as the core part of the gate electrode 32A. The third conductive material layer 34A and a third conductive material layer 34B to be described later are composed of e.g. tungsten (W). A gate insulating film 31A is formed between the gate electrode 32A and a channel forming region 27A. The gate insulating film 31A and a gate insulating film 31B to be described later are composed of e.g. $HfO_2$.

Of the shell part and the core part surrounded by the shell part of the gate electrode 32B of the PMOS 100B, at least the shell part is composed of a second conductive material different from the first conductive material. The purpose of the provision of the second conductive material and the above-described first conductive material is to control the work functions. More specifically, the gate electrode 32B is formed of a second conductive material layer 33B that is deposited in the gate electrode formation opening 29B (see FIG. 2D) and is composed of the second conductive material (e.g., ruthenium (Ru)) different from the first conductive material, and the third conductive material layer 34B deposited on the second conductive material layer 33B. The second conductive material layer 33B is formed as the shell part of the gate electrode 32B, and the third conductive material layer 34B is formed as the core part of the gate electrode 32B. A gate insulating film 31B is formed between the gate electrode 32B and a channel forming region 27B.

On the top surfaces of the gate electrodes 32A and 32B of the NMOS 100A and the PMOS 100B, protective layers 35A and 35B having electric conductivity are formed. The protective layers 35A and 35B are formed based on e.g. selective CVD employing tungsten (W). The gate electrode contact plug 44A for the NMOS 100A is connected via the protective layer 35A to the top surface of the gate electrode 32A of the NMOS 100A. The gate electrode contact plug 44B for the PMOS 100B is connected via the protective layer 35B to the top surface of the gate electrode 32B of the PMOS 100B.

With reference to FIGS. 2A to 2M, a method for manufacturing the semiconductor device of the first embodiment will be described below. These drawings are each a partial sectional view or partial end view equivalent to the partial sectional view along the three-dot chain line indicated by arrowheads A in FIG. 1A. In these drawings, hatching of a semiconductor substrate 10 serving as the base is omitted for simplification of the drawings. This is the same also in drawings relating to other embodiments to be described later.

[Step-100]

Initially, the semiconductor substrate 10 (base) is prepared that is composed of silicon (Si) and includes the channel forming regions 27A and 27B of the NMOS 100A and the PMOS 100B, the source/drain regions 24, the first insulating layer 28A, the gate electrode formation openings 29A and 29B provided in this first insulating layer 28A for the NMOS 100A and the PMOS 100B, and the gate insulating films 31A and 31B provided at least on the bottoms of the gate electrode formation openings 29A and 29B. The specific procedure will be described below.

Specifically, initially element isolation regions 11 having e.g. a trench structure are formed in the semiconductor substrate 10 based on a publicly-known method. Furthermore, a well region and so on of a predetermined conductivity type are formed between the element isolation regions 11, and then the surface of the semiconductor substrate 10 is oxidized by e.g. a pyrogenic method to thereby form an insulating film 21. Thereafter, e.g. a polycrystalline silicon layer 22 is formed on the entire surface by CVD, and then an SiN layer is formed on the entire surface. Subsequently, the SiN layer, the polycrystalline silicon layer 22, and the insulating film 21 other than predetermined partial portions are removed through patterning. This can form dummy gate electrodes 22A and 22B formed of the polycrystalline silicon layer 22, and dummy gate insulating films 21A and 21B formed of the insulating film 21. On the dummy gate electrodes 22A and 22B, mask layers 23A and 23B formed of the SiN layer are provided. Subsequently, with use of the dummy gate electrodes 22A and 22B as a mask, (more specifically, with use of the mask layers 23A and 23B, the dummy gate electrodes 22A and 22B, and the dummy gate insulating films 21A and 21B as a mask), shallow ion implantation is performed for regions corresponding to the source/drain regions 24 in the semiconductor substrate 10. This can obtain the structure shown in FIG. 2A.

Thereafter, an SiN film is formed on the entire surface by CVD and this SiN film is etched back, to thereby form gate sidewalls 25 on the side parts of the mask layers 23A and 23B and the dummy gate electrodes 22A and 22B. Subsequently, deep ion implantation is performed for the semiconductor substrate 10 with use of the dummy gate electrodes 22A and 22B and the gate sidewalls 25 as the mask, and then activation annealing treatment is carried out. Subsequently, low-resistance layers 26 composed of e.g. a cobalt silicide are formed in a self-aligned manner by a known method. Through this step, the source/drain regions 24 including extension regions and the low-resistance layers 26 can be formed (see FIG. 2B). The regions each sandwiched between the extension regions of the source/drain regions 24 serve as the channel forming regions 27A and 27B. Although the dummy gate electrodes 22A and 22B are composed of polycrystalline silicon, they are not turned to a silicide because the mask layers 23A and 23B are formed thereon.

[Step-110]

Subsequently, the first insulating layer 28A composed of $SiO_2$ is formed on the entire surface based on e.g. CVD. Thereafter, the first insulating layer 28A is so planarized by e.g. known CMP that the top surfaces of the dummy gate electrodes 22A and 22B are exposed (see FIG. 2C). It is also possible for the first insulating layer 28A to have a two-layer structure including the following insulating films: a stress liner layer composed of SiN and an $SiO_2$ film formed thereon.

After the planarization, the dummy gate electrodes 22A and 22B are selectively removed by e.g. an etching technique in which a radical of fluorine or the like is used. Thereafter, the dummy gate insulating films 21A and 21B are selectively removed by e.g. a wet etching technique employing a diluted hydrofluoric acid or the like. This forms the gate electrode formation openings 29A and 29B for the NMOS 100A and the PMOS 100B (see FIG. 2D).

Figure 2E:
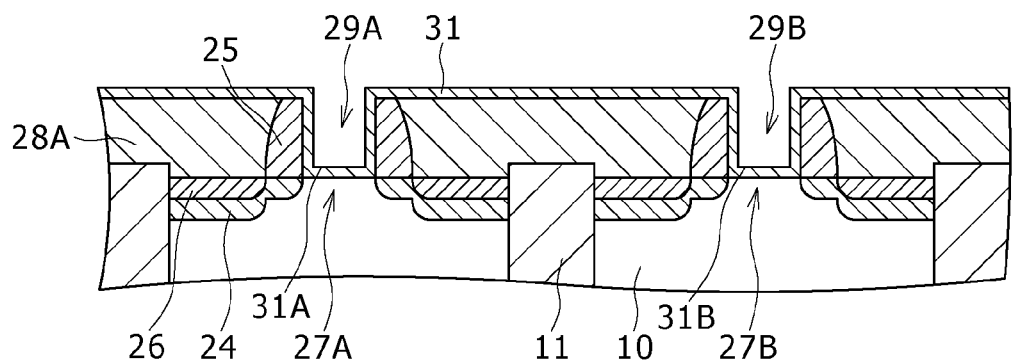
Figure 2F:
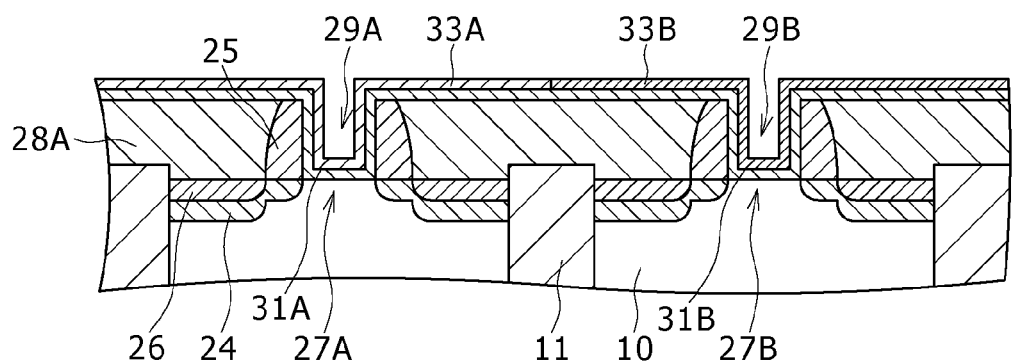

Subsequently, an insulating film 31 composed of $HfO_2$ is formed by e.g. ALD on the entire surface including the bottoms and the sidewalls of the gate electrode formation openings 29A and 29B (see FIG. 2E). The partial portions of the insulating film 31 formed in the gate electrode formation openings 29A and 29B serve as the gate insulating films. For convenience, the partial portions of the insulating film 31 formed in the gate electrode formation openings 29A and 29B are indicated by reference numerals 31A and 31B, respectively.

Through [Step-100] and [Step-110], the semiconductor substrate 10 (base) can be obtained that is composed of silicon (Si) and includes the channel forming regions 27A and 27B of the NMOS 100A and the PMOS 100B, the source/drain regions 24, the first insulating layer 28A, the gate electrode formation openings 29A and 29B provided in this first insulating layer 28A for the NMOS 100A and the PMOS 100B, and the gate insulating films 31A and 31B provided at least on the bottoms of the gate electrode formation openings 29A and 29B (in the first embodiment, provided on the bottoms and the sidewalls of the gate electrode formation openings 29A and 29B).

[Step-120]

The gate electrode formation opening 29A has a bottom region and side region (the bottom region and the side region will be often referred to collectively as a "shell region") and a center region (the remaining part of the gate electrode formation opening, and it will be often referred to as a "core region") surrounded by the shell region. A first conductive material layer composed of a first conductive material is formed at least in the shell region of the gate electrode formation opening 29A. This allows formation of the gate electrode 32A of which at least shell part is composed of the first conductive material. Furthermore, the gate electrode formation opening 29B also has the shell region and the core region surrounded by the shell region. At least in this shell region, a second conductive material layer composed of a second conductive material different from the first conductive material is formed. This allows formation of the gate electrode 32B of which at least shell part is composed of the second conductive material. The specific step will be described below.

Specifically, initially the first conductive material layer 33A composed of the first conductive material (e.g., $HfSi_x$) is formed to cover the formation area of the NMOS 100A. More specifically, the first conductive material layer 33A is formed on the entire surface by e.g. PVD. In the first embodiment, the first conductive material layer 33A is so formed as to cover the shell region of the gate electrode formation opening 29A and leave the core region of the gate electrode formation opening 29A.

Subsequently, on the first conductive material layer 33A, a mask (not shown) that has an opening corresponding to the area in which the PMOS 100B is to be formed is formed based on known material and method. Thereafter, by a known etching method, the first conductive material layer 33A in the area in which the PMOS 100B is to be formed is removed. Subsequently, the mask is removed, and then the second conductive material layer 33B composed of the second conductive material different from the first conductive material, such as ruthenium (Ru), is formed on the entire surface by e.g. PVD. In the first embodiment, the second conductive material layer 33B is so formed as to cover the shell region of the gate electrode formation opening 29B and leave the core region of the gate electrode formation opening 29B. Thereafter, a mask (not shown) that covers the area in which the PMOS 100B is to be formed is formed. Subsequently, by a known etching method, the second conductive material layer 33B in the area in which the NMOS 100A is to be formed is removed in such a way that the first conductive material layer 33A in this area is left. Subsequently, the mask is removed. Through this step, the structure shown in FIG. 2F can be obtained.

[Step-130]

Subsequently, a third conductive material layer 34 composed of tungsten (W) is formed on the entire surface by e.g. CVD. Specifically, the core regions of the gate electrode formation openings 29A and 29B are filled with the third conductive material layer 34 (see FIG. 2G). The partial portions of the third conductive material layer 34 formed in the core regions of the gate electrode formation openings 29A and 29B are indicated by reference numerals 34A and 34B, respectively. After the formation of the third conductive material layer 34, the entire surface is so smoothed by e.g. known CMP that the first insulating layer 28A is exposed (see FIG. 2H).

Through [Step-120] and [Step-130], the gate electrodes 32A and 32B buried in the gate electrode formation openings 29A and 29B can be obtained.

In the first embodiment, in the gate electrode 32A of the NMOS 100A, the core part surrounded by the shell part is composed of a conductive material different from the first conductive material. Furthermore, in the gate electrode 32B of the PMOS 100B, the core part surrounded by the shell part is composed of a conductive material different from the second conductive material.

Specifically, as described above, the gate electrode 32A is formed of the first conductive material layer 33A composed of the first conductive material ($HfSi_x$) for work function control, and the third conductive material layer 34A that is deposited on the first conductive material layer 33A and composed of tungsten (W). The first conductive material layer 33A is formed as the shell part of the gate electrode 32A, and the third conductive material layer 34A is formed as the core part of the gate electrode 32A. On the other hand, the gate electrode 32B is formed of the second conductive material layer 33B composed of the second conductive material (ruthenium (Ru)) for work function control, different from the first conductive material, and the third conductive material layer 34B that is deposited on the second conductive material layer 33B and composed of tungsten (W). The second conductive material layer 33B is formed as the shell part of the gate electrode 32B, and the third conductive material layer 34B is formed as the core part of the gate electrode 32B.

[Step-140]

Subsequently, on the top surfaces of the gate electrodes 32A and 32B of the NMOS 100A and the PMOS 100B, protective layers having electric conductivity are formed. In the first embodiment, by e.g. known selective CVD employing tungsten (W), the protective layers 35A and 35B composed of tungsten (W) are formed on the top surfaces of the gate electrodes 32A and 32B (see FIG. 2I). Alternatively, electroless plating may be used to form the protective layers 35A and 35B.

[Step-150]

Figure 2G:
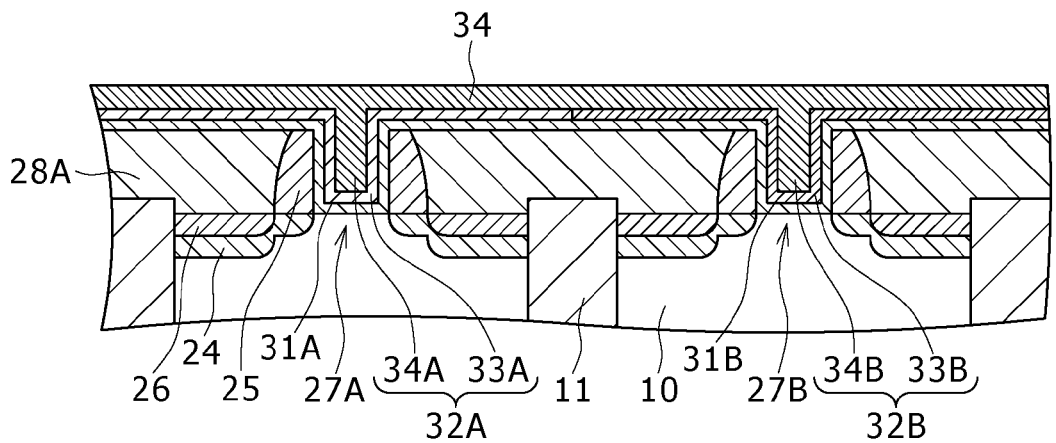
Figure 2H:
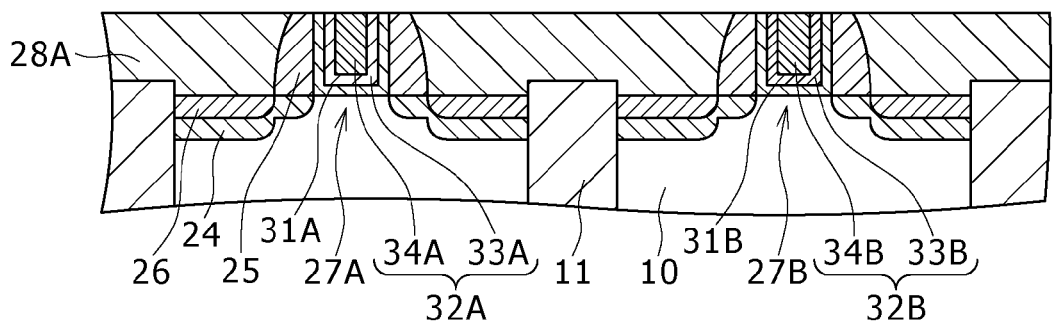
Figure 2I:
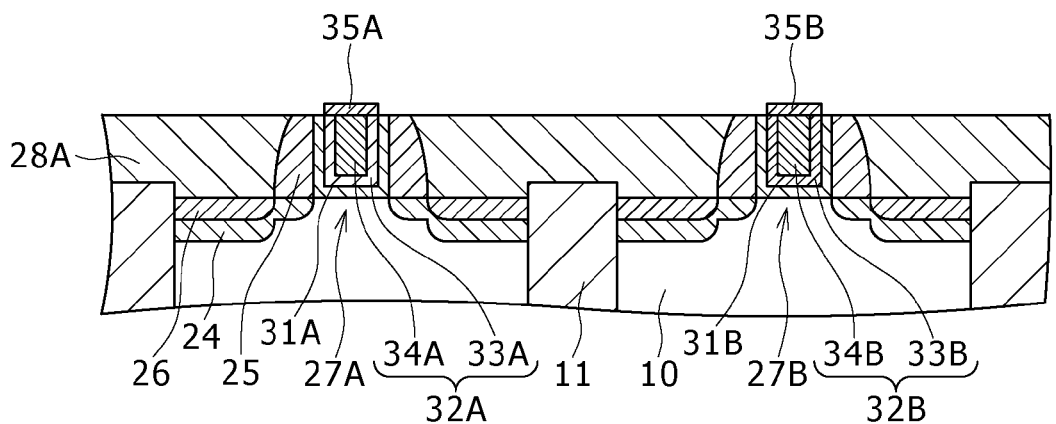
Figure 2J:
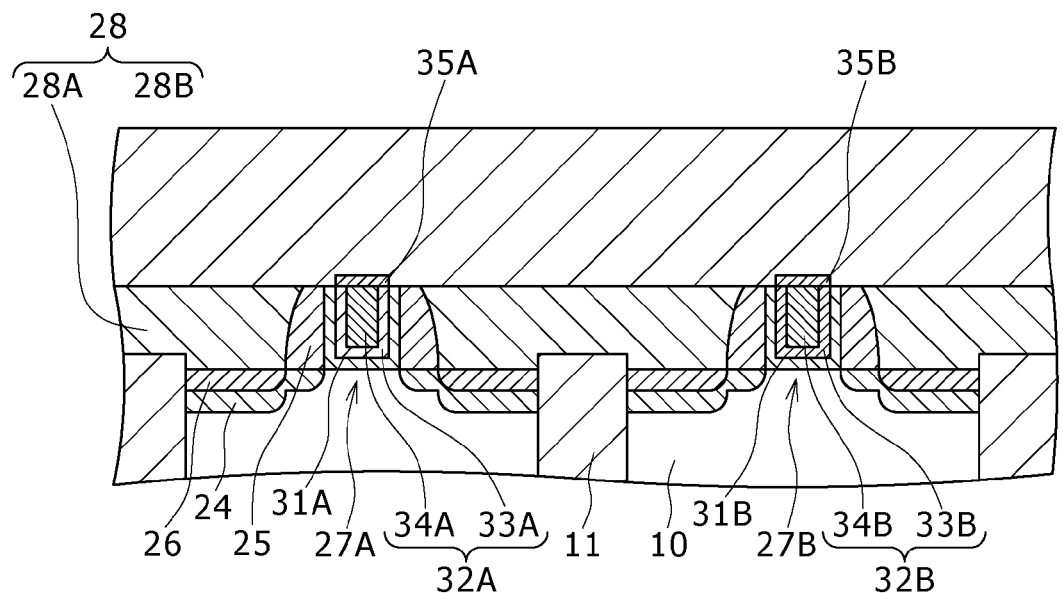
Figure 2K:
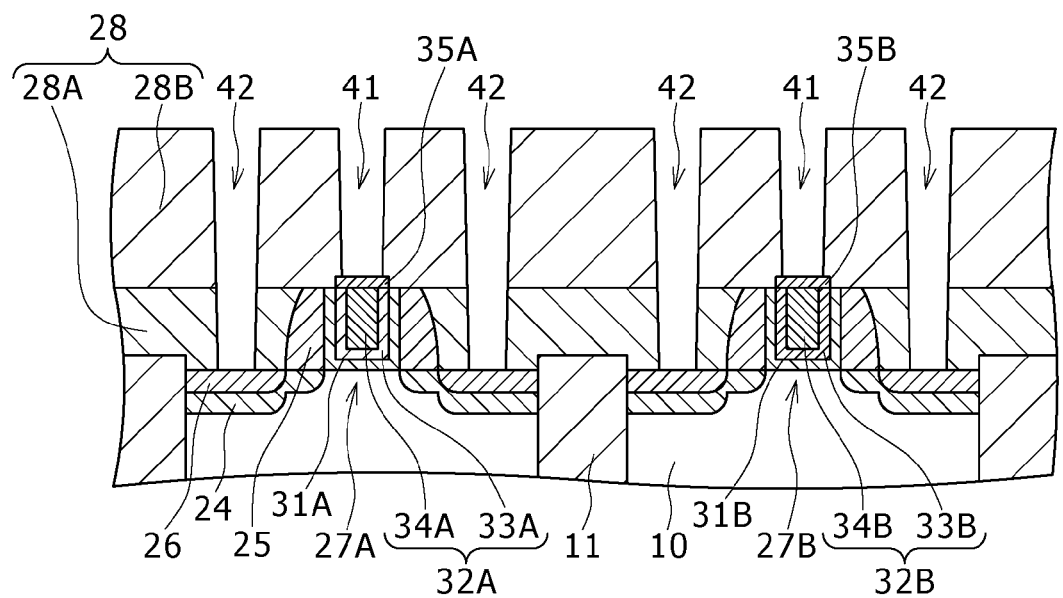

Thereafter, the second insulating layer 28B composed of $SiO_2$ is formed on the entire surface based on e.g. CVD, so that the interlayer insulating layer 28 formed of the second insulating layer 28B and the first insulating layer 28A can be obtained (see FIG. 2J).

[Step-160]

Subsequently, the following contact plugs are formed: the gate electrode contact plug 44A that penetrates the second insulating layer 28B and is connected via the protective layer 35A to the top surface of the gate electrode 32A of the NMOS 100A; the gate electrode contact plug 44B that penetrates the second insulating layer 28B and is connected via the protective layer 35B to the top surface of the gate electrode 32B of the PMOS 100B; the source/drain region contact plugs 45A that penetrate the first insulating layer 28A and the second insulating layer 28B and are connected to the source/drain regions 24 of the NMOS 100A; and the source/drain region contact plugs 45B that penetrate the first insulating layer 28A and the second insulating layer 28B and are connected to the source/drain regions 24 of the PMOS 100B. The specific step will be described below.

Specifically, initially a resist layer (not shown) having apertures provided at predetermined positions is formed as a mask on the interlayer insulating layer 28. Subsequently, by a known etching technique such as dry etching with use of this resist layer, contact plug formation openings 41 and 42 are formed in the interlayer insulating layer 28. The contact plug formation openings 41 are formed corresponding to the respective gate electrodes 32A and 32B. The contact plug formation openings 42 are formed corresponding to the respective source/drain regions 24 (see FIG. 2K). As shown in the drawing, the protective layers 35A and 35B are exposed at the bottoms of the contact plug formation openings 41. Therefore, in the etching process for providing the contact plug formation openings in the interlayer insulating layer 28, the etching selection ratios of the conductive materials of the gate electrodes 32A and 32B have no influence.

[Step-170]

Figure 2L:
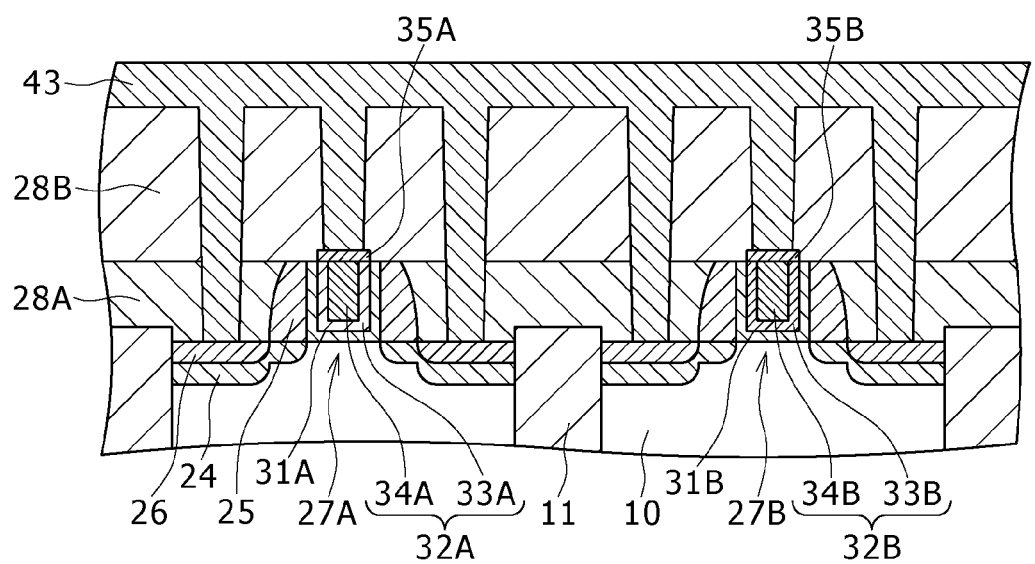

Thereafter, a so-called barrier metal layer (not shown) formed of e.g. a TiN layer is formed, and then tungsten (W) is deposited based on blanket CVD, to thereby fill the contact plug formation openings 41 and 42 with a fourth conductive material layer 43 (see FIG. 2L). As described later, the fourth conductive material layer 43 in the contact plug formation openings 41 will serve as the gate electrode contact plugs 44A and 44B, and the fourth conductive material layer 43 in the contact plug formation openings 42 will serve as the source/drain region contact plugs 45A and 45B.

Figure 2M:
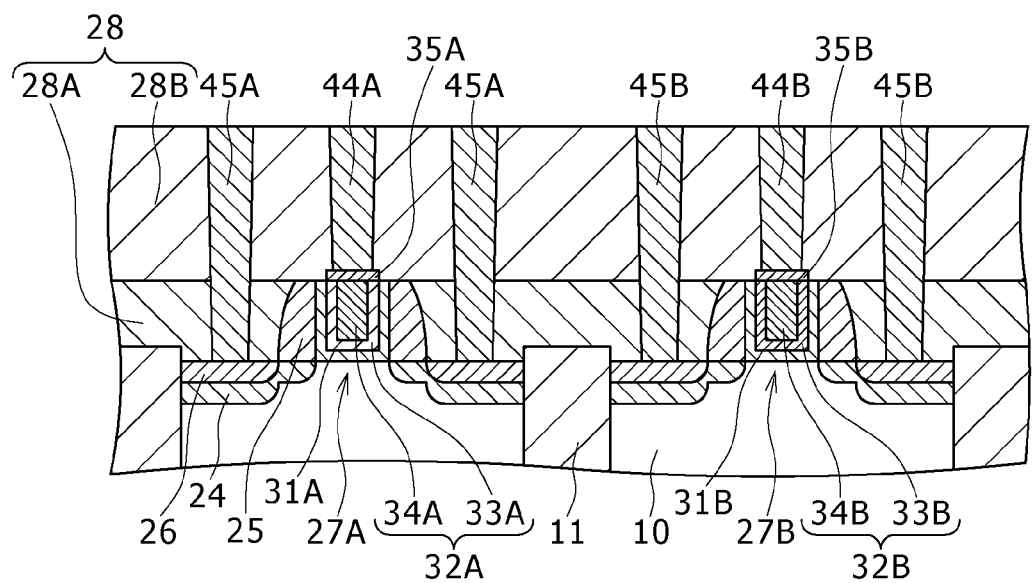

Thereafter, the entire surface is so smoothed by e.g. known CMP that the interlayer insulating layer 28 (more specifically, the second insulating layer 28B) is exposed (see FIG. 2M).

Through [Step-160] and [Step-170], the gate electrode contact plugs 44A and 44B and the source/drain region contact plugs 45A and 45B can be obtained.

[Step-180]

Thereafter, interconnects and so on (not shown) are formed on the interlayer insulating layer 28 according to need, so that the semiconductor device of the first embodiment can be achieved.

In the semiconductor device of the first embodiment, the protective layers 35A and 35B are exposed at the bottoms of the contact plug formation openings 41. Therefore, neither the gate electrode 32A nor 32B is etched. Furthermore, the gate electrodes 32A and 32B each arise from stacking of two conductive material layers. Specifically, the shell part of the gate electrode 32A is formed of the first conductive material layer 33A composed of the first conductive material, and the shell part of the gate electrode 32B is formed of the second conductive material layer 33B composed of the second conductive material different from the first conductive material. Therefore, the work function values of the gate electrodes 32A and 32B can be set to ones favorable for the channel forming regions 27A and 27B. Moreover, because the core parts of the gate electrodes 32A and 32B are composed of a conductive material having low resistivity, the electric resistance of the gate electrodes 32A and 32B can be lowered.

Second Embodiment

Figure 3:
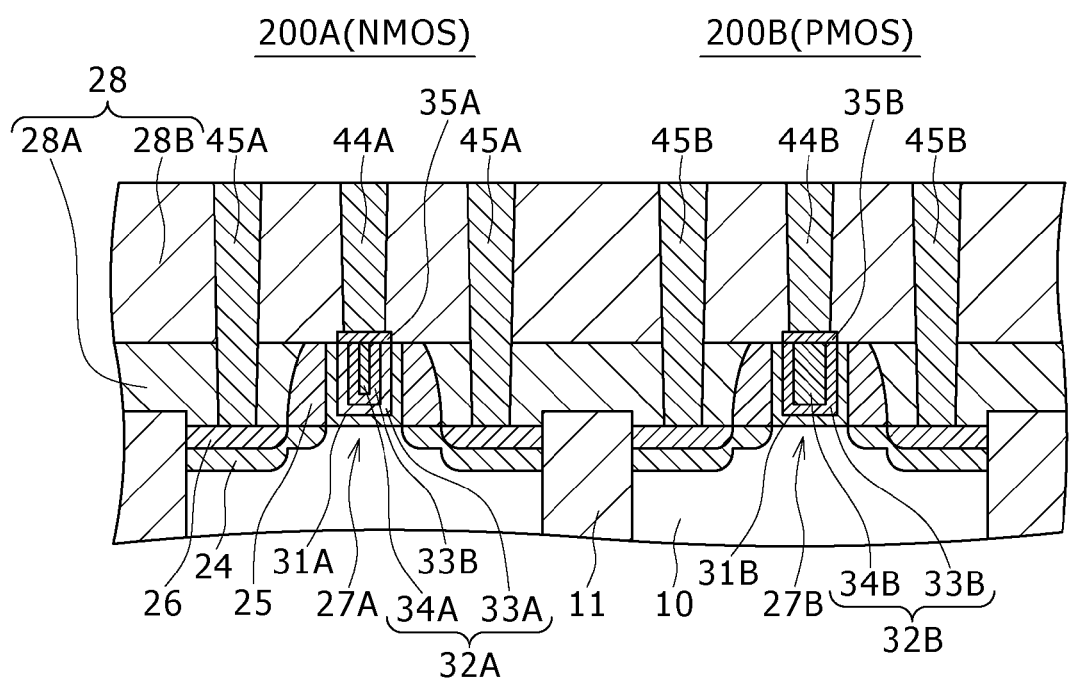
FIG. 3 is a partial sectional view of a semiconductor device according to a second embodiment of the present invention, equivalent to the partial sectional view along the three-dot chain line indicated by arrowheads A in FIG. 1A.

A second embodiment of the present invention is a modification of the first embodiment. A projected image of an NMOS 200A and a PMOS 200B included in a semiconductor device of the second embodiment is the same as that of FIG. 1A. FIG. 3 is a partial sectional view of the semiconductor device of the second embodiment, equivalent to the partial sectional view along the three-dot chain line indicated by arrowheads A in FIG. 1A. Components of the NMOS 200A and the PMOS 200B are basically the same as those in the first embodiment, and hence are given the same reference numerals as those in the first embodiment. This is the same also in other embodiments to be described later.

Figure 4A:
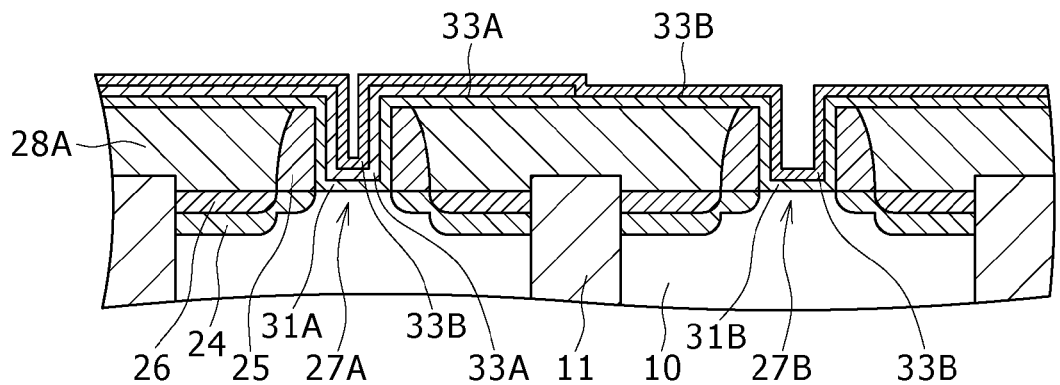
FIGS. 4A to 4C are schematic partial end views of a semiconductor substrate and so on, for explaining a method for manufacturing the semiconductor device of the second embodiment.
Figure 4B:
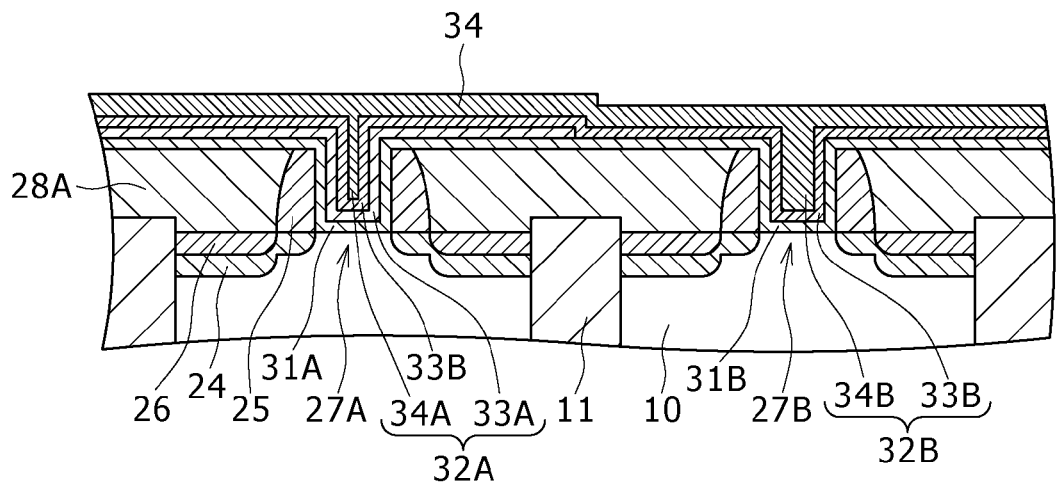
Figure 4C:
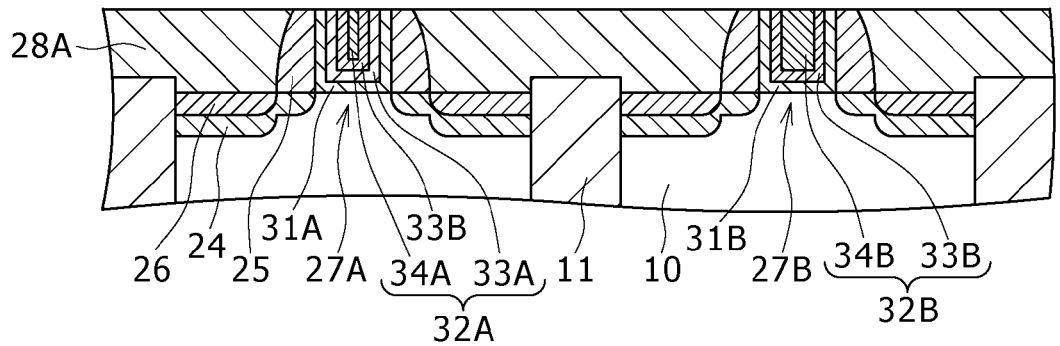

The second embodiment is different from the first embodiment in that a gate electrode 32A of the NMOS 200A has a multilayer structure formed of conductive material layers 33A, 33B, and 34A. With reference to FIGS. 4A to 4C, a method for manufacturing the semiconductor device of the second embodiment will be described below.

[Step-200]

Initially, based on steps similar to [Step-100] and [Step-110] of the first embodiment, a semiconductor substrate 10 (base) is obtained that is composed of silicon (Si) and includes channel forming regions 27A and 27B of the NMOS 200A and the PMOS 200B, source/drain regions 24, a first insulating layer 28A, gate electrode formation openings 29A and 29B provided in this first insulating layer 28A for the NMOS 200A and the PMOS 200B, and gate insulating films 31A and 31B provided at least on the bottoms of the gate electrode formation openings 29A and 29B.

[Step-210]

Subsequently, basically based on steps similar to [Step-120] and [Step-130] of the first embodiment, the gate electrode 32A is formed in the gate electrode formation opening 29A. Furthermore, a gate electrode 32B is formed in the gate electrode formation opening 29B. The specific step will be described below.

Specifically, initially, based on a step similar to [Step-120] of the first embodiment, the first conductive material layer 33A composed of a first conductive material (e.g., HfSi$_x$) is formed to cover the formation area of the NMOS 200A (specifically, formed on the entire surface).

Subsequently, based on a step similar to [Step-120] of the first embodiment, a mask (not shown) that has an opening corresponding to the area in which the PMOS 200B is to be formed is formed on the first conductive material layer 33A based on known material and method. Thereafter, by a known etching method, the first conductive material layer 33A in the area in which the PMOS 200B is to be formed is removed. Subsequently, the mask is removed, and then the second conductive material layer 33B composed of a second conductive material different from the first conductive material, such as ruthenium (Ru), is formed on the entire surface by e.g. PVD. In the first embodiment, as the subsequent step, the second conductive material layer 33B in the area in which the NMOS 100A is to be formed is removed in such a way that the first conductive material layer 33A in this area is left. In contrast, in the second embodiment, this step is omitted. Thus, the structure shown in FIG. 4A is obtained.

[Step-220]

Thereafter, based on a step similar to [Step-130] of the first embodiment, a third conductive material layer 34 is formed on the entire surface (see FIG. 4B), and then the entire surface is so smoothed by e.g. known CMP that the first insulating layer 28A is exposed (see FIG. 4C).

Through [Step-210] and [Step-220], the gate electrodes 32A and 32B buried in the gate electrode formation openings 29A and 29B can be obtained (see FIGS. 4B and 4C).

[Step-230]

Subsequently, steps similar to [Step-140] to [Step-180] of the first embodiment are carried out, so that the semiconductor device of the second embodiment shown in FIG. 3 can be achieved.

In the semiconductor device of the second embodiment, the gate electrode 32A arises from stacking of three conductive material layers. However, the shell part of the gate electrode 32A is formed of the first conductive material layer 33A composed of the first conductive material for work function control, similarly to the first embodiment. Therefore, the work function value of the gate electrode 32A is the same as that in the first embodiment.

Third Embodiment

Figure 5:
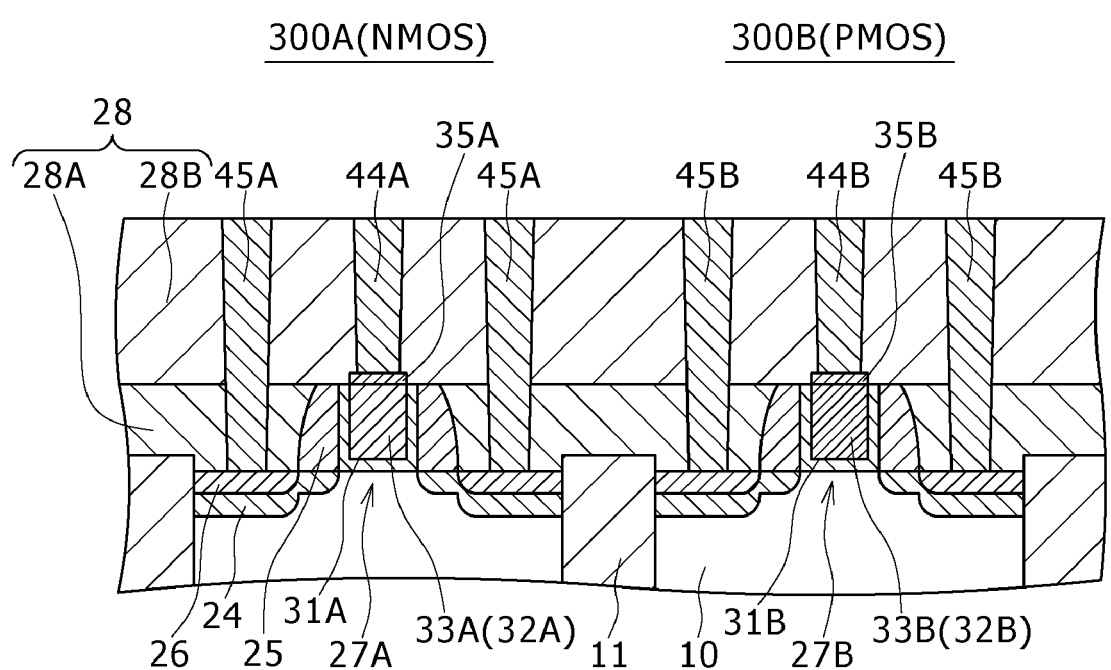
FIG. 5 is a partial sectional view of a semiconductor device according to a third embodiment of the present invention, equivalent to the partial sectional view along the three-dot chain line indicated by arrowheads A in FIG. 1A.

A third embodiment of the present invention is also a modification of the first embodiment. A projected image of an NMOS 300A and a PMOS 300B included in a semiconductor device of the third embodiment is the same as that of FIG. 1A. FIG. 5 is a partial sectional view of the semiconductor device of the third embodiment, equivalent to the partial sectional view along the three-dot chain line indicated by arrowheads A in FIG. 1A.

Figure 6A:
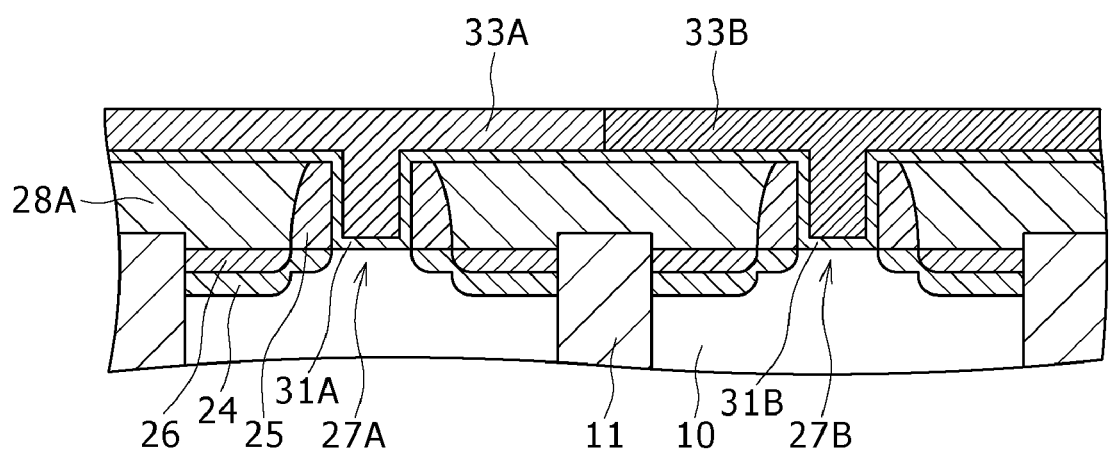
FIGS. 6A and 6B are schematic partial end views of a semiconductor substrate and so on, for explaining a method for manufacturing the semiconductor device of the third embodiment.
Figure 6B:
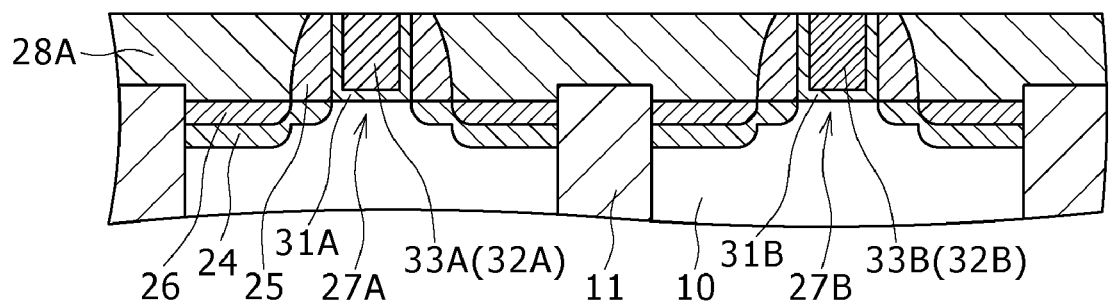
Figure 7:
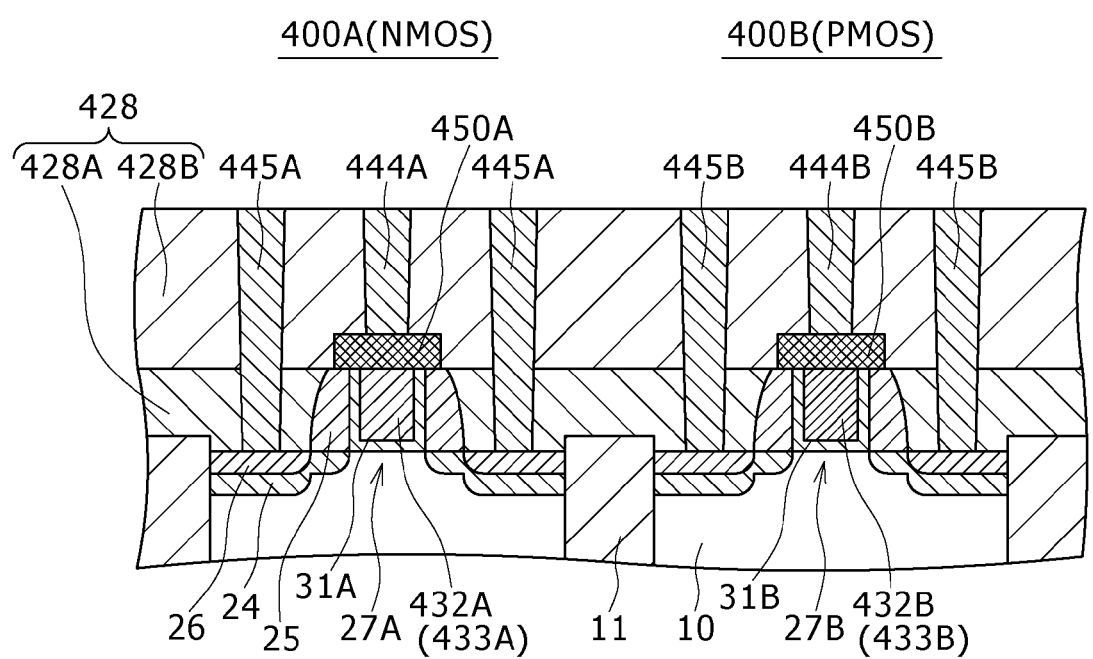
FIG. 7 is a partial sectional view of a semiconductor device according to a fourth embodiment of the present invention, equivalent to the partial sectional view along the three-dot chain line indicated by arrowheads A in FIG. 1A.

The third embodiment is different from the first embodiment mainly in that formation of a third conductive material layer 34 is omitted. With reference to FIGS. 6A and 6B, a method for manufacturing the semiconductor device of the third embodiment will be described below.

[Step-300]

Initially, based on steps similar to [Step-100] and [Step-110] of the first embodiment, a semiconductor substrate 10 (base) is obtained that is composed of silicon (Si) and includes channel forming regions 27A and 27B of the NMOS 300A and the PMOS 300B, source/drain regions 24, a first insulating layer 28A, gate electrode formation openings 29A and 29B provided in this first insulating layer 28A for the NMOS 300A and the PMOS 300B, and gate insulating films 31A and 31B provided at least on the bottoms of the gate electrode formation openings 29A and 29B.

[Step-310]

Subsequently, basically based on steps similar to [Step-120] and [Step-130] of the first embodiment, a gate electrode 32A is formed in the gate electrode formation opening 29A. Furthermore, a gate electrode 32B is formed in the gate electrode formation opening 29B. The specific step will be described below.

Specifically, based on a step similar to [Step-120] of the first embodiment, initially a first conductive material layer 33A composed of a first conductive material (e.g., HfSi$_x$) is formed to cover the formation area of the NMOS 300A. In the first embodiment, the first conductive material layer 33A is formed in such a way that the core region of the gate electrode formation opening 29A is left. In contrast, in the third embodiment, the first conductive material layer 33A is formed to fill the whole of the gate electrode formation opening 29A (i.e., the shell region and the core region), which is a difference from the first embodiment. This is the same also for a second conductive material layer 33B to be described later.

Subsequently, based on a step similar to [Step-120] of the first embodiment, a mask (not shown) that has an opening corresponding to the area in which the PMOS 300B is to be formed is formed on the first conductive material layer 33A. Thereafter, by a known etching method, the first conductive material layer 33A in the area in which the PMOS 300B is to be formed is removed. Subsequently, the mask is removed, and then the second conductive material layer 33B is formed on the entire surface by e.g. PVD. Thereafter, a mask (not shown) that covers the area in which the PMOS 300B is to be formed is formed. Subsequently, by a known etching method, the second conductive material layer 33B in the area in which the NMOS 300A is to be formed is removed in such a way that the first conductive material layer 33A in this area is left. Subsequently, the mask is removed. Through this step, the structure shown in FIG. 6A can be obtained.

[Step-320]

Thereafter, based on a step similar to [Step-130] of the first embodiment, the entire surface is so smoothed by e.g. known CMP that the first insulating layer 28A is exposed (see FIG. 6B). As described above, the third embodiment is different from the first embodiment in that the entire surface is smoothed without the formation of the third conductive material layer 34, which is carried out in [Step-130] of the first embodiment.

Through the above-described steps, the gate electrodes 32A and 32B buried in the gate electrode formation openings 29A and 29B can be obtained.

[Step-330]

Subsequently, steps similar to [Step-140] to [Step-180] of the first embodiment are carried out, so that the semiconductor device of the third embodiment shown in FIG. 5 can be achieved.

In the third embodiment, in the gate electrode 32A of the NMOS 300A, the shell part and the core part are formed of the first conductive material layer. Furthermore, in the gate electrode 32B of the PMOS 300B, the shell part and the core part are formed of the second conductive material layer.

In the semiconductor device of the third embodiment, the whole of the gate electrode 32A is formed of the first conductive material layer 33A, and the whole of the gate electrode 32B is formed of the second conductive material layer 33B. The third embodiment is advantageous over the first and second embodiments in that the formation process for the third conductive material layer 34 can be omitted.

Fourth Embodiment

Figure 11:
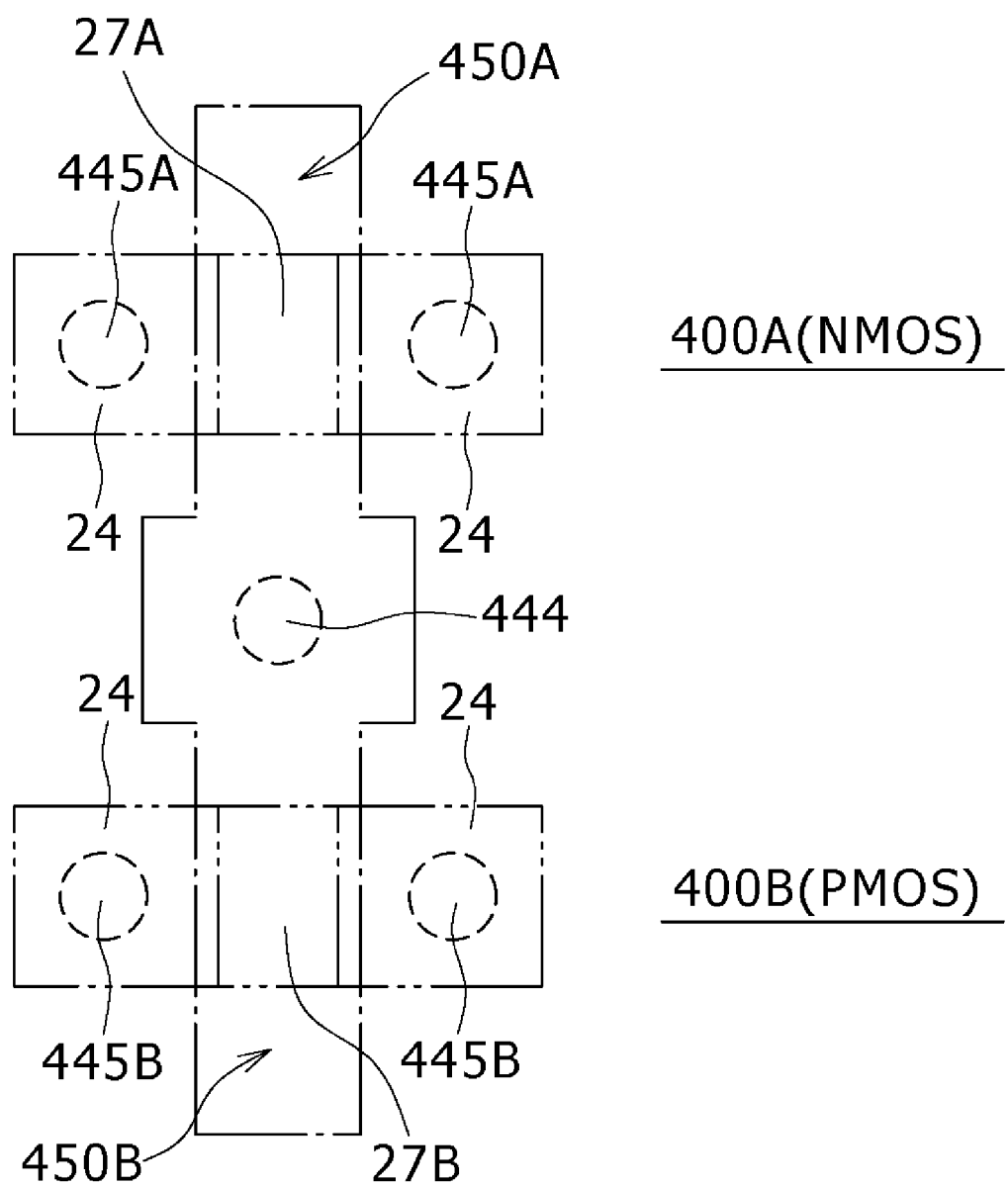
FIG. 11 is a diagram schematically showing a projected image of an N-channel insulated gate field effect transistor and a P-channel insulated gate field effect transistor included in a modification example of the semiconductor device of the fourth embodiment.

A fourth embodiment of the present invention relates to a semiconductor device and a method for manufacturing the same according to the second embodiment of the present invention. A projected image of an NMOS 400A and a PMOS 400B included in a semiconductor device of the fourth embodiment is the same as that of FIG. 1(A). FIG. 11 is a partial sectional view of the semiconductor device of the fourth embodiment, equivalent to the partial sectional view along the three-dot chain line indicated by arrowheads A in FIG. 1A.

Similarly to the first embodiment, the semiconductor device of the fourth embodiment includes the NMOS 400A as an N-channel insulated gate field effect transistor and the PMOS 400B as a P-channel insulated gate field effect transistor. Furthermore, this semiconductor device includes an insulating layer 428A. In this semiconductor device, gate electrodes 432A and 432B of the NMOS 400A and the PMOS 400B are buried in gate electrode formation openings 29A and 29B provided in the insulating layer 428A. The gate electrode 432A of the NMOS 400A is composed of a first conductive material (specifically, HfSi$_x$) for work function control. The gate electrode 432B of the PMOS 400B is composed of a second conductive material (specifically, TiN) for work function control, different from the first conductive material. Moreover, interconnect layers 450A and 450B are formed to cover the top surfaces of the gate electrodes 432A and 432B of the NMOS 400A and the PMOS 400B. In the fourth embodiment, the interconnect layers 450A and 450B are each formed of one conductive material layer, specifically, a tungsten layer. A gate insulating film 31A is formed between the gate electrode 432A and a channel forming region 27A. A gate insulating film 31B is formed between the gate electrode 432B and a channel forming region 27B. The gate insulating films 31A and 31B are composed of e.g. HfO$_2$.

Figure 8A:
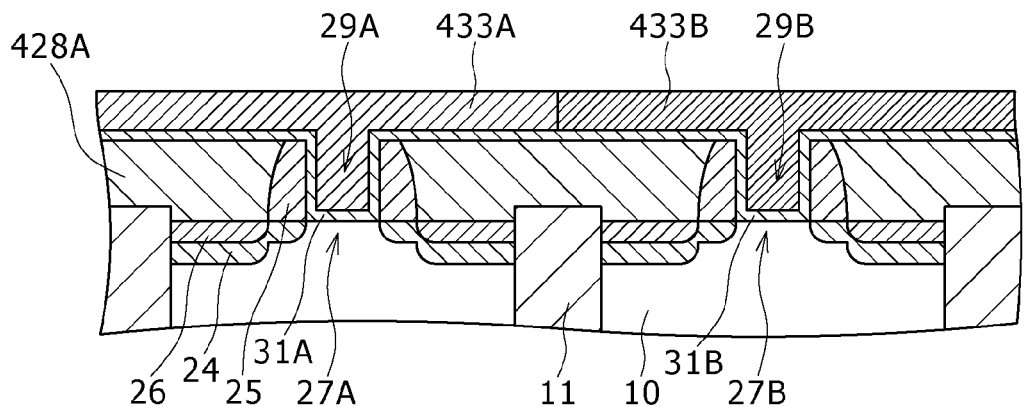
FIGS. 8A to 8C are schematic partial end views of a semiconductor substrate and so on, for explaining a method for manufacturing the semiconductor device of the fourth embodiment.
Figure 8B:
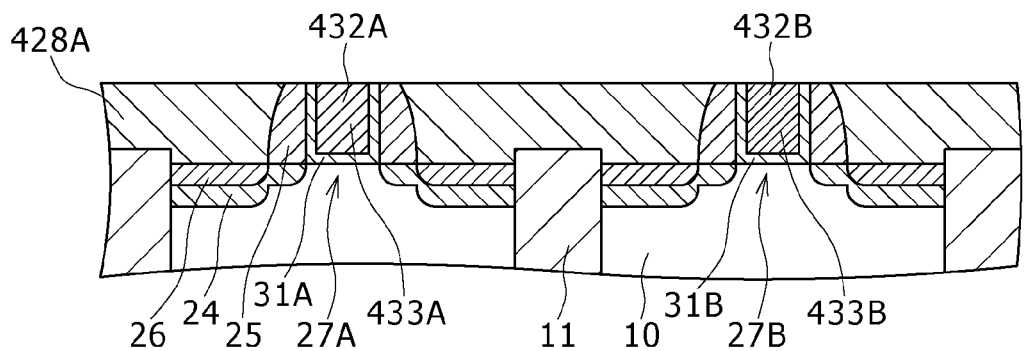
Figure 8C:
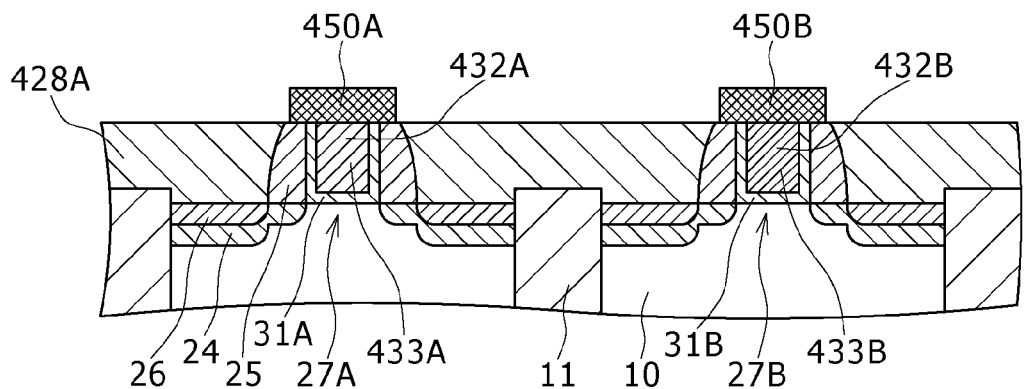

With reference to FIGS. 8A to 8C, a method for manufacturing the semiconductor device of the fourth embodiment will be described below. These drawings are each a partial sectional view or partial end view equivalent to the partial sectional view along the three-dot chain line indicated by arrowheads A in FIG. 1A.

[Step-400]

Initially, a semiconductor substrate 10 (base) is prepared that is composed of silicon (Si) and includes the channel forming regions 27A and 27B of the NMOS 400A and the PMOS 400B, source/drain regions 24, the insulating layer 428A, the gate electrode formation openings 29A and 29B provided in this insulating layer 428A for the NMOS 400A and the PMOS 400B, and the gate insulating films 31A and 31B provided at least on the bottoms of the gate electrode formation openings 29A and 29B. Specifically, steps similar to [Step-100] and [Step-110] of the first embodiment are carried out. For example, in the 32-nm-node technology (Hp 45 nm), the width of the gate electrode formation openings 29A and 29B is set to about 20 to 30 nm. However, the present embodiment is not limited to such a value.

[Step-410]

Subsequently to the preparation of the semiconductor device 10, in the gate electrode formation opening 29A for the NMOS 400A, the gate electrode 432A composed of the first conductive material (specifically, $HfSi_x$) is formed. Furthermore, in the gate electrode formation opening 29B for the PMOS 400B, the gate electrode 432B composed of the second conductive material (specifically, TiN) different from the first conductive material is formed.

Specifically, initially a first conductive material layer 433A composed of the first conductive material ($HfSi_x$) is formed based on e.g. ALD in such a manner as to cover the formation area of the NMOS 400A. In the fourth embodiment, the first conductive material layer 433A is formed on the entire surface including the inside of the gate electrode formation opening 29A. Subsequently, based on a step similar to [Step-120] of the first embodiment, a mask (not shown) that has an opening corresponding to the area in which the PMOS 400B is to be formed is formed on the first conductive material layer 433A. Thereafter, by a known etching method, the first conductive material layer 433A in the area in which the PMOS 400B is to be formed is removed. Subsequently, the mask is removed, and then a second conductive material layer 433B is formed on the entire surface based on e.g. ALD. Thereafter, a mask (not shown) that covers the area in which the PMOS 400B is to be formed is formed. Subsequently, by a known etching method, the second conductive material layer 433B in the area in which the NMOS 400A is to be formed is removed in such a way that the first conductive material layer 433A in this area is left. Subsequently, the mask is removed. Through this step, the structure shown in FIG. 8A can be obtained.

[Step-420]

Thereafter, based on a step similar to [Step-130] of the first embodiment, the entire surface is so smoothed by e.g. known CMP that the insulating layer 428A is exposed (see FIG. 8B).

[Step-430]

Subsequently, the interconnect layers 450A and 450B are formed to cover the top surfaces of the gate electrodes 432A and 432B of the NMOS 400A and the PMOS 400B (see FIG. 8C). The interconnect layers 450A and 450B can be obtained as follows. Specifically, a so-called barrier metal layer (not shown) formed of e.g. a TiN layer with a thickness of 5 to 20 nm is formed on the entire surface. Thereafter, a tungsten (W) layer having a thickness of 30 to 100 nm is deposited on the entire surface based on CVD, and then the tungsten layer and the barrier metal layer are subjected to patterning based on known lithography and etching techniques. By setting the width of the interconnect layers 450A and 450B larger than that of the gate electrodes 432A and 432B, the interconnect layers 450A and 450B can be so formed as to cover the top surfaces of the gate electrodes 432A and 432B. For example, in the 32-nm-node technology (Hp 45 nm), when the width of the gate electrode formation openings 29A and 29B is set to about 20 to 30 nm, it is desirable that the width of the interconnect layers 450A and 450B be set to about 30 to 40 nm.

The interconnect layers 450A and 450B have also the same function as that of the protective layers 35A and 35B in the first embodiment.

[Step-440]

Thereafter, based on a step similar to [Step-150] of the first embodiment, a second insulating layer 428B composed of $SiO_2$ is formed on the entire surface based on e.g. CVD, so that an interlayer insulating layer 428 formed of the second insulating layer 428B and the insulating layer (first insulating layer) 428A can be obtained. Subsequently, based on a step similar to [Step-160] of the first embodiment, the following contact plugs are formed: a gate electrode contact plug 444A that penetrates the second insulating layer 428B and is connected to the interconnect layer 450A; a gate electrode contact plug 444B that penetrates the second insulating layer 428B and is connected to the interconnect layer 450B; source/drain region contact plugs 445A that penetrate the first insulating layer 428A and the second insulating layer 428B and are connected to the source/drain regions 24 of the NMOS 400A; and source/drain region contact plugs 445B that penetrate the first insulating layer 428A and the second insulating layer 428B and are connected to the source/drain regions 24 of the PMOS 400B. Specifically, steps similar to [Step-160] and [Step-170] of the first embodiment are carried out. Thereafter, interconnects and so on (not shown) are formed on the interlayer insulating layer 428 according to need, so that the semiconductor device of the fourth embodiment shown in FIG. 11 can be achieved.

Figure 9A:
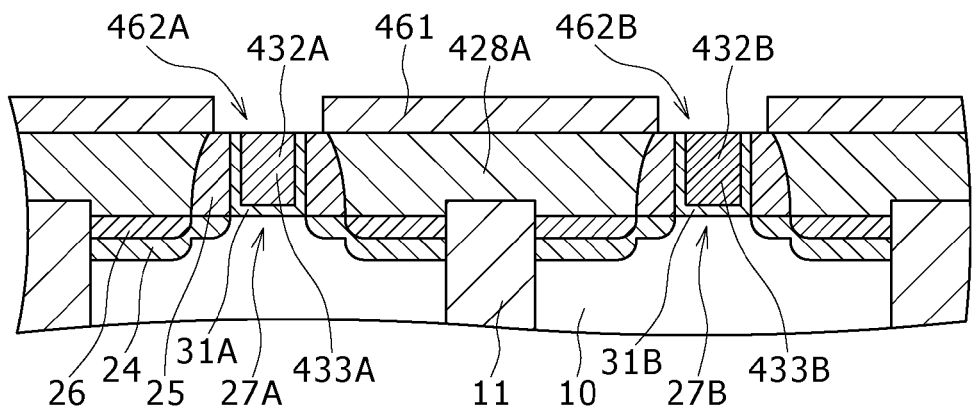
FIGS. 9A to 9C are schematic partial end views of a semiconductor substrate and so on, for explaining a modification example of a method for manufacturing the semiconductor device of the fourth embodiment.
Figure 9B:
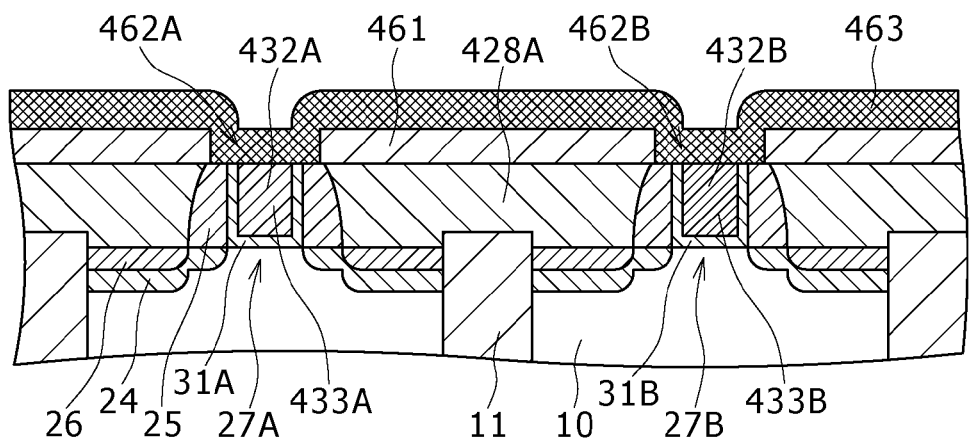
Figure 9C:
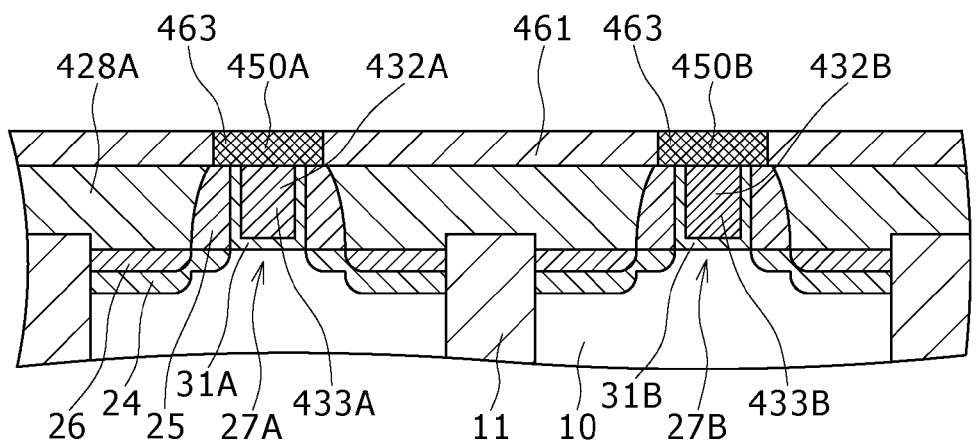

In the step similar to [Step-430], the interconnect layers may be formed based on a so-called damascene process. Specifically, as shown in FIGS. 9A to 9C, initially an upper insulating layer 461 composed of $SiO_2$ is formed on the entire surface, and then the partial portions of the upper insulating layer 461 above the top surfaces of the gate electrodes 432A and 432B of the NMOS 400A and the PMOS 400B are selectively removed (specifically, removed through photolithography and etching steps), to thereby provide interconnect layer trenches 462A and 462B in the upper insulating layer 461 (see FIG. 9A). By setting the width of the interconnect layer trenches 462A and 462B larger than that of the gate electrodes 432A and 432B, the interconnect layers can be so formed as to cover the top surfaces of the gate electrodes 432A and 432B. Thereafter, the interconnect layer trenches 462A and 462B are filled with a conductive material layer 463 composed of Cu (see FIG. 9B). Subsequently, the conductive material layer 463 on the upper insulating layer 461 is removed based on e.g. CMP or etchback, so that interconnect layers 450A and 450B are formed (see FIG. 9C).

Fifth Embodiment

A fifth embodiment of the present invention is a modification of the fourth embodiment. In the fourth embodiment, the interconnect layers 450A and 450B are each formed of a tungsten layer. In contrast, in the fifth embodiment, each interconnect layer has a multilayer structure formed of a lower conductive material layer and upper conductive material layer. The lower conductive material layer is formed of a silicon layer (specifically, an amorphous silicon layer), and the upper conductive material layer is formed of a silicide layer (specifically, a cobalt silicide layer). Except for this feature, a semiconductor device of the fifth embodiment has the same configuration and structure as those of the semiconductor device of the fourth embodiment. Therefore, detailed description of the semiconductor device of the fifth embodiment is omitted.

In the fifth embodiment, in a step similar to [Step-430] of the fourth embodiment, a silicon layer is formed, and then this silicon layer is patterned. Subsequently, a metal layer is formed on the entire surface, and then heat treatment is performed for a reaction between a metal of the metal layer and silicon of the silicon layer, to thereby form interconnect layers each formed of a metal silicide layer, followed by removal of the metal layer on the insulating layer. Specifically, an amorphous silicon layer with a thickness of 50 to 150 nm is deposited on the entire surface based on low-pressure CVD. Instead of an amorphous silicon layer, a polycrystalline silicon layer may be deposited. Subsequently, based on lithography and etching techniques, the amorphous silicon layer is patterned into the shape of the interconnect layers. By setting the width of the patterned amorphous silicon layer larger than that of the gate electrodes 432A and 432B, the interconnect layers can be so formed as to cover the top surfaces of the gate electrodes 432A and 432B.

Thereafter, e.g. a nickel (Ni) layer with a thickness of 6 to 10 nm is deposited as a metal layer on the entire surface based on sputtering. Subsequently, RTA treatment is performed at a temperature of 350 to 500° C. for 30 seconds, to thereby turn the nickel layer (equivalent to the metal layer) on the patterned amorphous silicon layer into a silicide $NiSi_X$. Subsequently, the unreacted nickel layer on the interlayer insulating layer is removed by using $H_2SO_4/H_2O_2$. It is also possible to form the silicide layer through deposition of Co or NiPt instead of Ni. In any case, the temperature in the RTA treatment can be set appropriately.

This is the end of the description of preferred embodiments of the present invention. The invention however is not limited to these embodiments. The structures and configurations of the semiconductor devices described in the embodiments are merely examples and can be appropriately changed. In addition, the manufacturing steps and so on for the semiconductor devices described in the embodiments are also merely examples and can be appropriately changed.

In the embodiments, the gate electrode formation openings 29A and 29B are formed through the removal of the dummy gate electrodes 22A and 22B and the dummy gate insulating films 21A and 21B. Alternatively, the gate electrode formation openings 29A and 29B may be formed through removal of the dummy gate electrodes 22A and 22B. In this form, the dummy gate insulating films 21A and 21B can be directly used as gate insulating films as they are, and thus the formation of the gate insulating films 31A and 31B is basically unnecessary. However, the gate insulating films 31A and 31B may be further stacked on the dummy gate insulating films 21A and 21B. Furthermore, the gate sidewalls 25 may have a two-layer structure formed of a gate sidewall composed of SiN and a gate sidewall composed of $SiO_2$ in that order from the gate electrode side.

Figure 10:
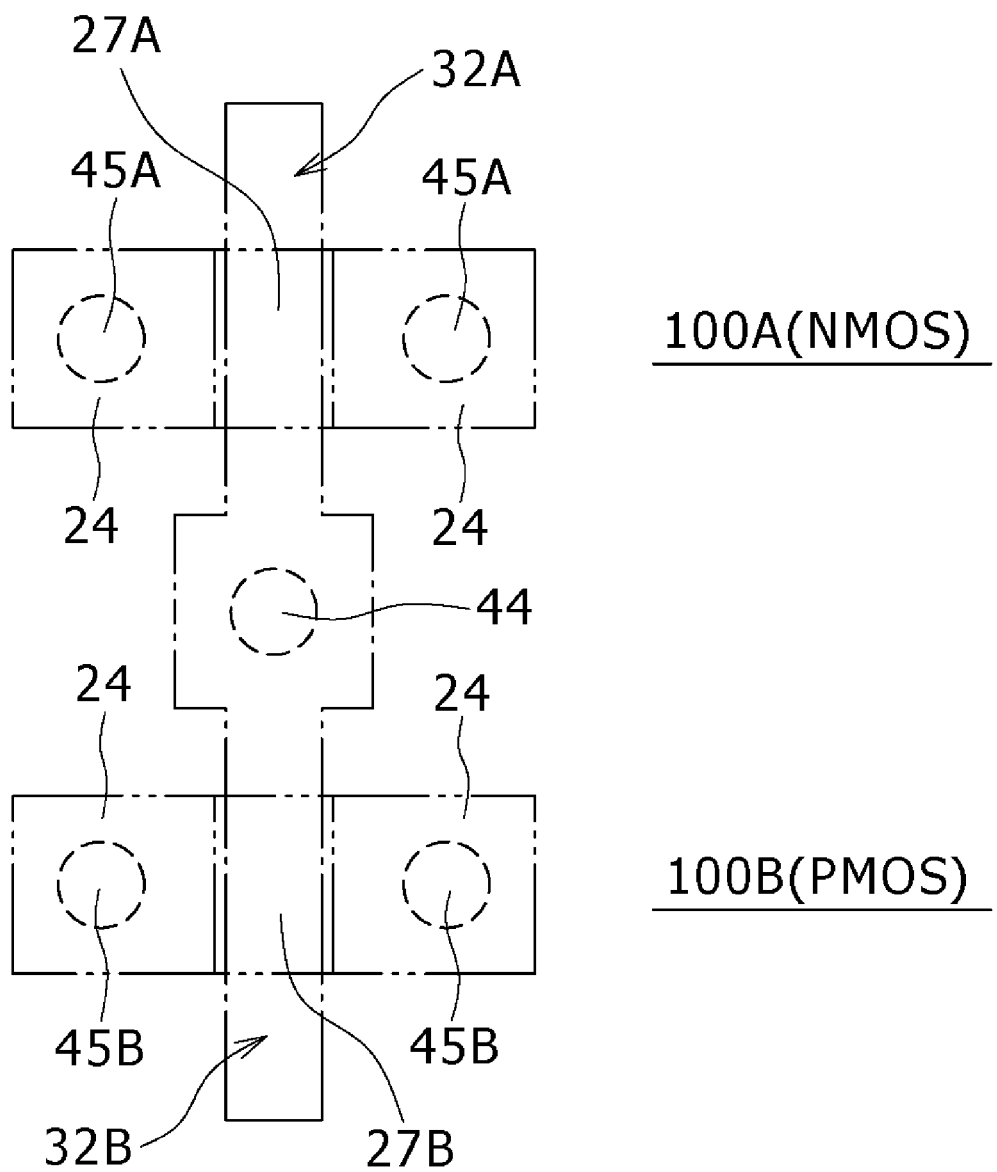
FIG. 10 is a diagram schematically showing a projected image of an N-channel insulated gate field effect transistor and a P-channel insulated gate field effect transistor included in a modification example of the semiconductor device of the first embodiment.

The first to third embodiments employ a configuration and structure in which an N-channel insulated gate field effect transistor and a P-channel insulated gate field effect transistor are juxtaposed to each other. However, insulated gate field effect transistors included in a semiconductor device are not limited to such a configuration and structure. For example, it is also possible to employ a configuration and structure that include a gate electrode common to an N-channel insulated gate field effect transistor and a P-channel insulated gate field effect transistor. That is, a CMOS semiconductor device having a so-called dual-gate structure may be employed. FIG. 10 schematically shows a projected image of an NMOS 100A and a PMOS 100B included in such a semiconductor device. In FIG. 10, the dashed line represents various kinds of contact plugs, the one-dot chain line represents a gate electrode, and the two-dot chain line represents source/drain regions and channel forming regions.

Figure 12A:
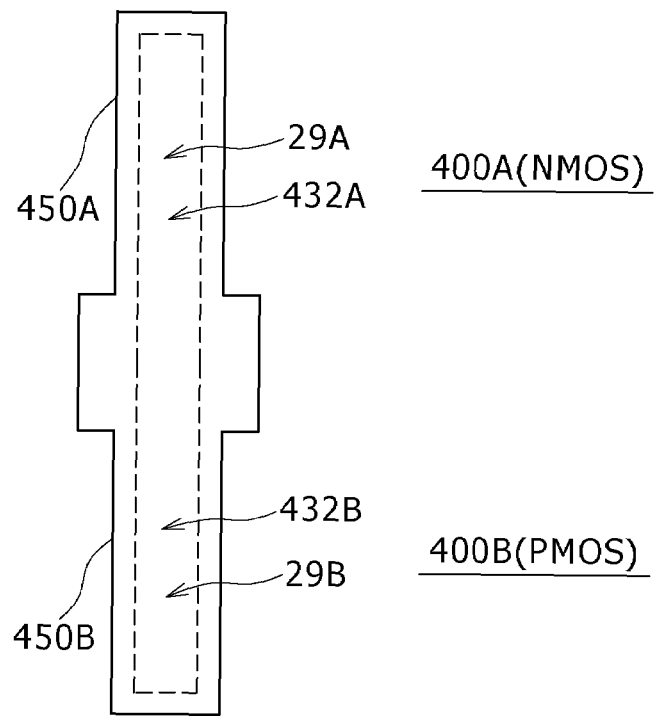
FIGS. 12A and 12B are diagrams schematically showing the arrangement relationship between interconnect layers and the gate electrodes of an N-channel insulated gate field effect transistor and a P-channel insulated gate field effect transistor included in a modification example of the semiconductor device of the fourth embodiment.
Figure 12B:
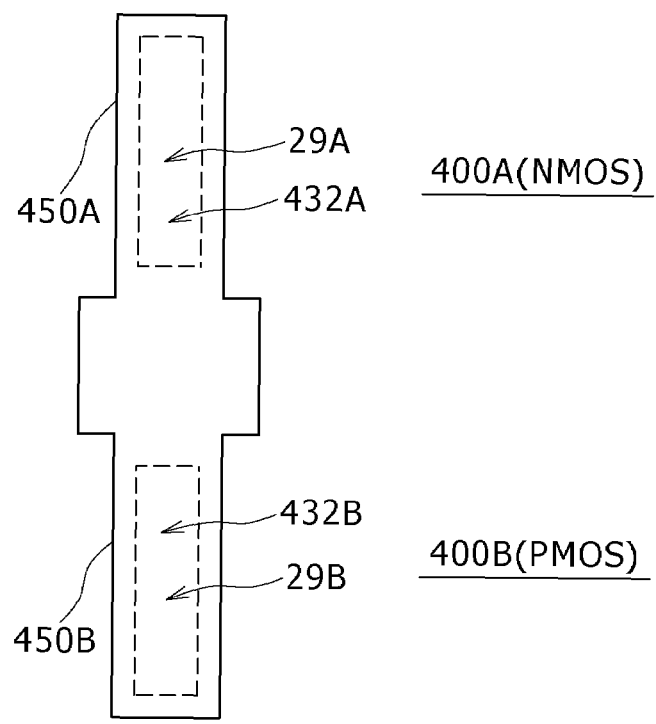

The fourth and fifth embodiments also employ a configuration and structure in which an N-channel insulated gate field effect transistor and a P-channel insulated gate field effect transistor are juxtaposed to each other. However, insulated gate field effect transistors included in a semiconductor device are not limited to such a configuration and structure. For example, it is also possible to employ a configuration and structure that include a gate electrode common to an N-channel insulated gate field effect transistor and a P-channel insulated gate field effect transistor. That is, a CMOS semiconductor device having a so-called dual-gate structure may be employed. FIG. 11 schematically shows a projected image of an NMOS 400A and a PMOS 400B included in such a semiconductor device. In FIG. 11, the dashed line represents various kinds of contact plugs, the one-dot chain line represents a gate electrode, and the two-dot chain line represents source/drain regions and channel forming regions. In this semiconductor device, an interconnect layer 450A formed to cover the top surface of a gate electrode 432A of the NMOS 400A and an interconnect layer 450B formed to cover the top surface of a gate electrode 432B of the PMOS 400B are a common interconnect layer. That is, an extended portion of the interconnect layer 450A formed to cover the top surface of the gate electrode 432A of the NMOS 400A is equivalent to the interconnect layer 450B formed to cover the top surface of the gate electrode 432B of the PMOS 400B. FIG. 12A is a schematic arrangement diagram of the interconnect layers 450A and 450B (indicated by the full line) and the gate electrodes 432A and 432B (indicated by the dotted line). As shown in FIG. 12A, the gate electrode 432B of the PMOS 400B may exist as an extension of the gate electrode 432A of the NMOS 400A. Alternatively, as shown in FIG. 12B as a schematic arrangement diagram of the interconnect layers 450A and 450B (indicated by the full line) and the gate electrodes 432A and 432B (indicated by the dotted line), an insulating layer 428A may exist between the gate electrode 432A of the NMOS 400A and the gate electrode 432B of the PMOS 400B (i.e., the gate electrode 432A of the NMOS 400A may be separated from the gate electrode 432B of the PMOS 400B).

In the first to fifth embodiments, the first insulating layer 28A or the insulating layer 428A has a single-layer structure composed of $SiO_2$. Alternatively, the layer may have a two-layer structure formed of an SiN stress liner layer and an $SiO_2$ insulating film.

Figure 13A:
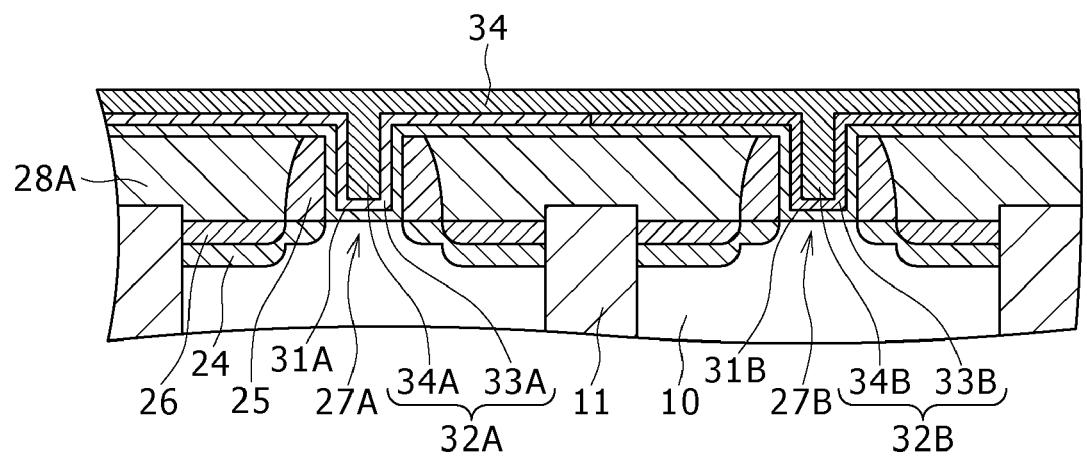
FIG. 13A is a diagram corresponding to the former stage of [Step-130] of the first embodiment.
Figure 13B:
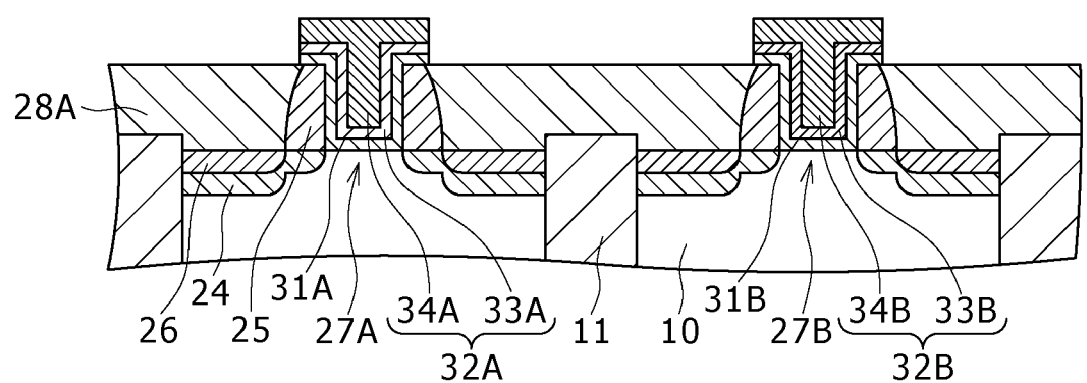
FIG. 13B is a diagram showing an example in which interconnect portions that cover gate electrodes are formed on a first insulating layer through pattering of conductive material layers on the first insulating layer.
Figure 14A:
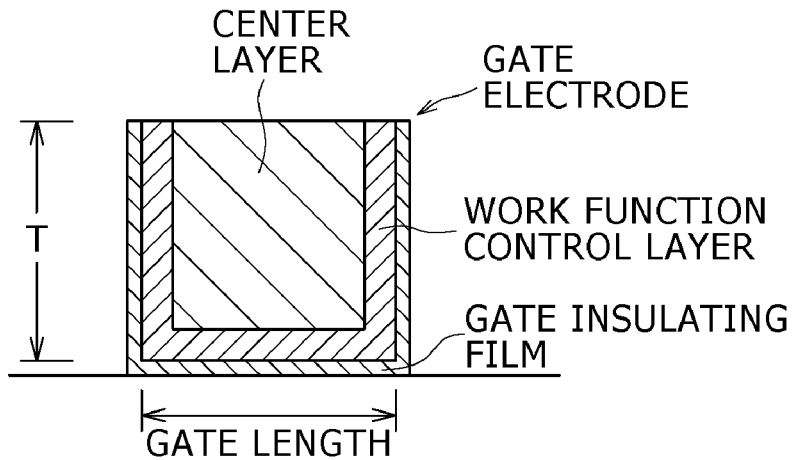
FIG. 14A is a schematic partial sectional view of an existing gate electrode formed by an existing damascene process.
Figure 14B:
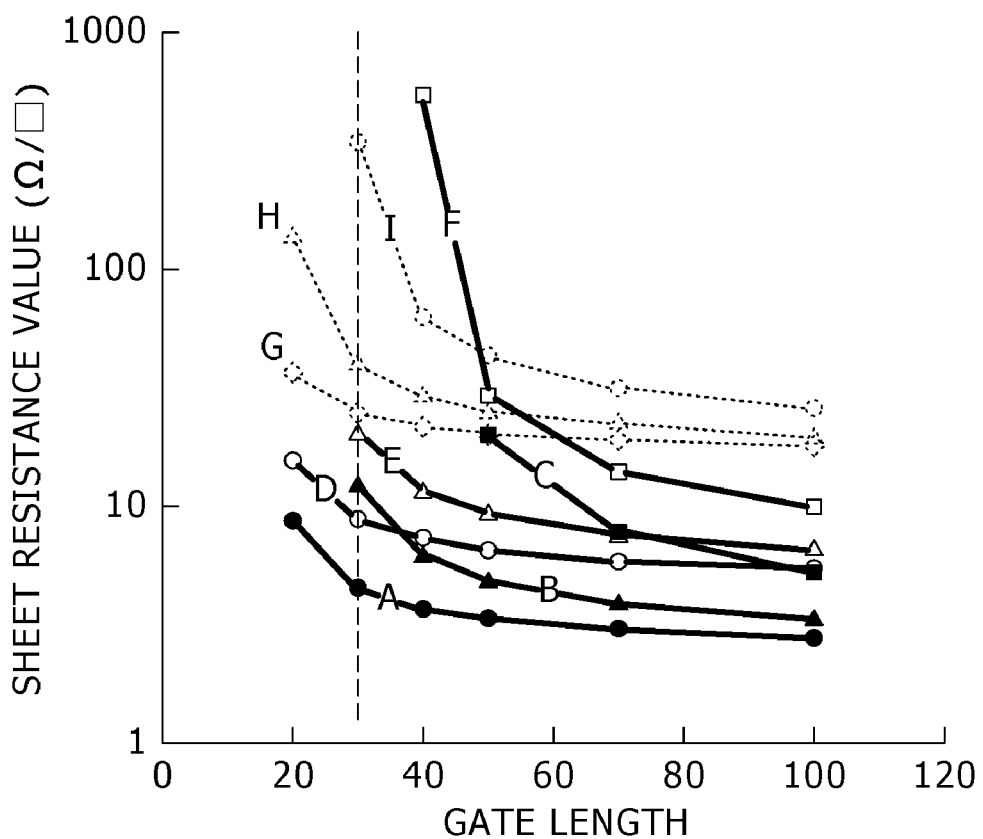
FIG. 14B is a graph showing results of calculation of the relationship between the gate length (GL) and the sheet resistance value of a gate electrode.

FIG. 13A is a diagram corresponding to the former stage of [Step-130] of the first embodiment (see FIG. 2G). In the first embodiment, in the latter stage of [Step-130], the entire surface is so smoothed by known CMP that the first insulating layer 28A is exposed. In contrast, in a modification example of the first embodiment shown in FIG. 13B, interconnect portions that cover the gate electrodes 32A and 32B are formed on the first insulating layer 28A through patterning of the conductive material layers on the first insulating layer 28A. Also in this modification example, the conductive material layer composed of the same material (specifically, the third conductive material layer 34) is formed above the gate electrodes 32A and 32B. Therefore, the differences in the etching selection ratio and so on among the materials of the gate electrode lead to no problem, and thus the etching process can be optimized based on the relationship between the interlayer insulating layer and the third conductive material layer 34.

In the embodiments of the present invention, the work function values of the gate electrodes are set to favorable ones by changing the materials of the gate electrodes. In contrast, there has also been proposed a method in which the work function value is adjusted by changing the material of the gate insulating film (refer to e.g. Japanese Patent Laid-open No. 2006-24594). In this case, the gate electrodes of an N-channel insulated gate field effect transistor and a P-channel insulated gate field effect transistor can be formed by using the same kind of conductive material. However, depending on the kind of the material of the gate electrodes, e.g. a problem possibly occurs in which etching resistance is insufficient in the formation process for contact plugs. For this case, formation of protective layers on the top surfaces of the gate electrodes is available.

What is claimed is:

1. A semiconductor device including an N-channel insulated gate field effect transistor and a P-channel insulated gate field effect transistor, the device comprising:
    a first insulating layer and a second insulating layer configured to be formed on the first insulating layer; and
    gate electrode contact plugs configured to penetrate the second insulating layer and be each connected to a respective one of gate electrodes of the N-channel insulated gate field effect transistor and the P-channel insulated gate field effect transistor, and source/drain region contact plugs configured to penetrate the first insulating layer and the second insulating layer and be each connected to a respective one of source/drain regions, wherein
    each of the gate electrodes of the N-channel insulated gate field effect transistor and the P-channel insulated gate field effect transistor is buried in a gate electrode formation opening provided in the first insulating layer,
    the gate electrode of the N-channel insulated gate field effect transistor has a bottom part, a side part, and a center part surrounded by the bottom part and the side part, and at least the bottom part and the side part are composed of a first conductive material,
    the gate electrode of the P-channel insulated gate field effect transistor has a bottom part, a side part, and a center part surrounded by the bottom part and the side part, and at least the bottom part and the side part are composed of a second conductive material different from the first conductive material,
    protective layers having electric conductivity are each formed on a top surface of a respective one of the gate electrodes of the N-channel insulated gate field effect transistor and the P-channel insulated gate field effect transistor, and
    the gate electrode contact plug for the N-channel insulated gate field effect transistor is connected via the protective layer to the top surface of the gate electrode of the N-channel insulated gate field effect transistor, and the gate electrode contact plug for the P-channel insulated gate field effect transistor is connected via the protective layer to the top surface of the gate electrode of the P-channel insulated gate field effect transistor.

2. The semiconductor device according to claim 1, wherein the center part of the gate electrode of the N-channel insulated gate field effect transistor is composed of the first conductive material.

3. The semiconductor device according to claim 1, wherein the center part of the gate electrode of the N-channel insulated gate field effect transistor is composed of a conductive material different from the first conductive material.

4. The semiconductor device according to claim 1, wherein the center part of the gate electrode of the P-channel insulated gate field effect transistor is composed of the second conductive material.

5. The semiconductor device according to claim 1, wherein the center part of the gate electrode of the P-channel insulated gate field effect transistor is composed of a conductive material different from the second conductive material.

6. A method for manufacturing a semiconductor device including an N-channel insulated gate field effect transistor and a P-channel insulated gate field effect transistor, the method comprising the steps of:
    preparing a base that includes channel forming regions and source/drain regions of the N-channel insulated gate field effect transistor and the P-channel insulated gate field effect transistor, a first insulating layer, gate electrode formation openings provided in the first insulating layer for the N-channel insulated gate field effect transistor and the P-channel insulated gate field effect transistor, and a gate insulating film provided at least on bottoms of the gate electrode formation openings;
    forming a first conductive material layer composed of a first conductive material at least in a bottom region and a side region of the gate electrode formation opening for the N-channel insulated gate field effect transistor, having the bottom region, the side region, and a center region surrounded by the bottom region and the side region, to thereby form a gate electrode of which at least bottom part and side part are composed of the first conductive material, and
    forming a second conductive material layer composed of a second conductive material different from the first conductive material at least in a bottom region and a side region of the gate electrode formation opening for the P-channel insulated gate field effect transistor, having the bottom region, the side region, and a center region surrounded by the bottom region and the side region, to thereby form a gate electrode of which at least bottom part and side part are composed of the second conductive material;
    forming protective layers having electric conductivity on top surfaces of the gate electrodes of the N-channel insulated gate field effect transistor and the P-channel insulated gate field effect transistor;
    forming a second insulating layer that covers an entire surface; and
    forming a gate electrode contact plug that penetrates the second insulating layer and is connected via the protective layer to the top surface of the gate electrode of the N-channel insulated gate field effect transistor, a gate electrode contact plug that penetrates the second insulating layer and is connected via the protective layer to the top surface of the gate electrode of the P-channel insulated gate field effect transistor, source/drain region contact plugs that penetrate the first insulating layer and the second insulating layer and are connected to the source/drain regions of the N-channel insulated gate field effect transistor, and source/drain region contact plugs that penetrate the first insulating layer and the second insulating layer and are connected to the source/drain regions of the P-channel insulated gate field effect transistor.

7. The method for manufacturing a semiconductor device according to claim 6, wherein
    the protective layers are formed by selective CVD.

8. The method for manufacturing a semiconductor device according to claim 6, wherein
in the gate electrode of the N-channel insulated gate field effect transistor, a center part surrounded by the bottom part and the side part is composed of the first conductive material.

9. The method for manufacturing a semiconductor device according to claim 6, wherein
in the gate electrode of the N-channel insulated gate field effect transistor, a center part surrounded by the bottom part and the side part is composed of a conductive material different from the first conductive material.

10. The method for manufacturing a semiconductor device according to claim 6, wherein
in the gate electrode of the P-channel insulated gate field effect transistor, a center part surrounded by the bottom part and the side part is composed of the second conductive material.

11. The method for manufacturing a semiconductor device according to claim 6, wherein
in the gate electrode of the P-channel insulated gate field effect transistor, a center part surrounded by the bottom part and the side part is composed of a conductive material different from the second conductive material.

12. A semiconductor device including an N-channel insulated gate field effect transistor and a P-channel insulated gate field effect transistor and being provided with an insulating layer, wherein:
each of gate electrodes of the N-channel insulated gate field effect transistor and the P-channel insulated gate field effect transistor is buried in a gate electrode formation opening provided in the insulating layer,
the gate electrode of the N-channel insulated gate field effect transistor is composed of a first conductive material,
the gate electrode of the P-channel insulated gate field effect transistor is composed of a second conductive material different from the first conductive material,
interconnect layers are formed to each cover a top surface of a respective one of the gate electrodes of the N-channel insulated gate field effect transistor and the P-channel insulated gate field effect transistor,
the interconnect layers each have a multilayer structure formed of a lower conductive material layer and an upper conductive material layer, and
the lower conductive material layer is formed of a silicon layer and the upper conductive material layer is formed of a silicide layer.

13. A method for manufacturing a semiconductor device including an N-channel insulated gate field effect transistor and a P-channel insulated gate field effect transistor, the method comprising the steps of:
preparing a base that includes channel forming regions and source/drain regions of the N-channel insulated gate field effect transistor and the P-channel insulated gate field effect transistor, an insulating layer, gate electrode formation openings provided in the insulating layer for the N-channel insulated gate field effect transistor and the P-channel insulated gate field effect transistor, and a gate insulating film provided at least on bottoms of the gate electrode formation openings;
forming a gate electrode composed of a first conductive material in the gate electrode formation opening for the N-channel insulated gate field effect transistor, and
forming a gate electrode composed of a second conductive material different from the first conductive material in the gate electrode formation opening for the P-channel insulated gate field effect transistor; and
forming interconnect layers that each cover a top surface of a respective one of the gate electrodes of the N-channel insulated gate field effect transistor and the P-channel insulated gate field effect transistor,
wherein,
the step of forming interconnect layers includes the steps of forming a silicon layer; patterning the silicon layer; forming a metal layer on an entire surface; carrying out heat treatment for a reaction between a metal of the metal layer and silicon of the silicon layer to thereby form the interconnect layers each formed of a metal silicide layer; and removing the metal layer on the insulating layer.

* * * * *